(12) United States Patent
Ka et al.

(10) Patent No.: US 10,229,637 B2
(45) Date of Patent: Mar. 12, 2019

(54) DISPLAY DEVICE

(71) Applicant: SAMSUNG DISPLAY CO., LTD., Yongin-si, Gyeonggi-do (KR)

(72) Inventors: Ji Hyun Ka, Yongin-si (KR); Min Ku Lee, Yongin-si (KR); Tae Hoon Kwon, Yongin-si (KR); Seung Kyu Lee, Yongin-si (KR); Jin Tae Jeong, Yongin-si (KR); Seung Ji Cha, Yongin-si (KR)

(73) Assignee: SANSUNG DISPLAY CO., LTD., Yongin-si, Gyeonggi-do (KR)

( * ) Notice: Subject to any disclaimer, the term of this patent is extended or adjusted under 35 U.S.C. 154(b) by 22 days.

(21) Appl. No.: 15/455,822

(22) Filed: Mar. 10, 2017

(65) Prior Publication Data

US 2017/0345367 A1 Nov. 30, 2017

(30) Foreign Application Priority Data

May 31, 2016 (KR) ........................ 10-2016-0067603

(51) Int. Cl.
    *G09G 3/32* (2016.01)
    *G09G 3/3233* (2016.01)
    *H01L 27/32* (2006.01)
(52) U.S. Cl.
    CPC ......... *G09G 3/3233* (2013.01); *H01L 27/326* (2013.01); *H01L 27/3262* (2013.01);
    (Continued)
(58) Field of Classification Search
    CPC .. G09G 3/3208; G09G 3/3233; G09G 3/3258; G09G 2300/0452; G09G 2300/0819; G09G 2300/0842; G09G 2310/0294; G09G 2320/0204; G09G 2320/0223; G09G 2320/0233; H01L 27/1251; H01L 27/3216; H01L 27/3218; H01L 27/326; H01L 27/3262;
    (Continued)

(56) References Cited

U.S. PATENT DOCUMENTS 7,221,337 B1* 5/2007 Choi ................... G09G 3/3233
                                                            345/76
9,030,618 B2  5/2015 Jeon
                (Continued)

FOREIGN PATENT DOCUMENTS

EP         2 568 504 A2    3/2013
KR      10-0987724 B1      10/2010
                (Continued)

OTHER PUBLICATIONS

Extended European Search Report issued by the European Patent Office dated Oct. 6, 2017 with respect to co-pending European Patent Application No. 17173057.5 filed on May 26, 2017.

*Primary Examiner* — Michael J Eurice
(74) *Attorney, Agent, or Firm* — Lee & Morse, P.C.

(57) ABSTRACT

A display device includes a first pixel region and a second pixel region having different widths. First pixels in the first pixel region each include a first transistor. Second pixels in the second pixel region each include a second transistor performing a same function as the first transistor. At least one of a channel width and a channel length of the first transistor of the first and second pixels is be different from one another.

32 Claims, 24 Drawing Sheets

(52) U.S. Cl.
CPC . *H01L 27/3265* (2013.01); *G09G 2300/0842* (2013.01); *G09G 2320/0233* (2013.01)

(58) Field of Classification Search
CPC ............ H01L 27/3265; H01L 27/3244; H01L 29/42384; H01L 29/78696
See application file for complete search history.

(56) References Cited

U.S. PATENT DOCUMENTS

| | | | |
|---|---|---|---|
| 2002/0011980 A1* | 1/2002 | Aoyama | G09G 3/3648 |
| | | | 345/92 |
| 2003/0052618 A1 | 3/2003 | Ishizuka | |
| 2003/0197665 A1* | 10/2003 | Sung | G09G 3/3233 |
| | | | 345/82 |
| 2004/0085029 A1* | 5/2004 | Kimura | G09G 3/325 |
| | | | 315/291 |
| 2004/0178410 A1* | 9/2004 | Koo | H01L 27/12 |
| | | | 257/72 |
| 2005/0110727 A1* | 5/2005 | Shin | G09G 3/20 |
| | | | 345/76 |
| 2005/0119867 A1* | 6/2005 | Shin | G09G 3/3283 |
| | | | 702/189 |
| 2007/0109327 A1* | 5/2007 | Cok | G09G 3/2003 |
| | | | 345/690 |
| 2009/0115795 A1 | 5/2009 | Pae et al. | |
| 2009/0303260 A1 | 12/2009 | Takasugi | |
| 2010/0177024 A1 | 7/2010 | Choi | |
| 2010/0201675 A1 | 8/2010 | Kuranaga et al. | |
| 2013/0063330 A1* | 3/2013 | Eom | H01L 27/3262 |
| | | | 345/80 |
| 2014/0300529 A1 | 10/2014 | Kim et al. | |
| 2014/0354915 A1* | 12/2014 | Xu | G02F 1/13452 |
| | | | 349/58 |
| 2015/0235599 A1 | 8/2015 | Cho et al. | |
| 2016/0005346 A1 | 1/2016 | Kim | |
| 2017/0124948 A1* | 5/2017 | Minami | G09G 3/3233 |

FOREIGN PATENT DOCUMENTS

| | | |
|---|---|---|
| KR | 10-1064425 B1 | 9/2011 |
| KR | 10-1281681 B1 | 6/2013 |
| KR | 10-1376654 B1 | 3/2014 |
| KR | 10-2014-0044567 A | 4/2014 |
| KR | 10-2016-0005859 A | 1/2016 |
| WO | WO 2015/182043 A1 | 12/2015 |

\* cited by examiner

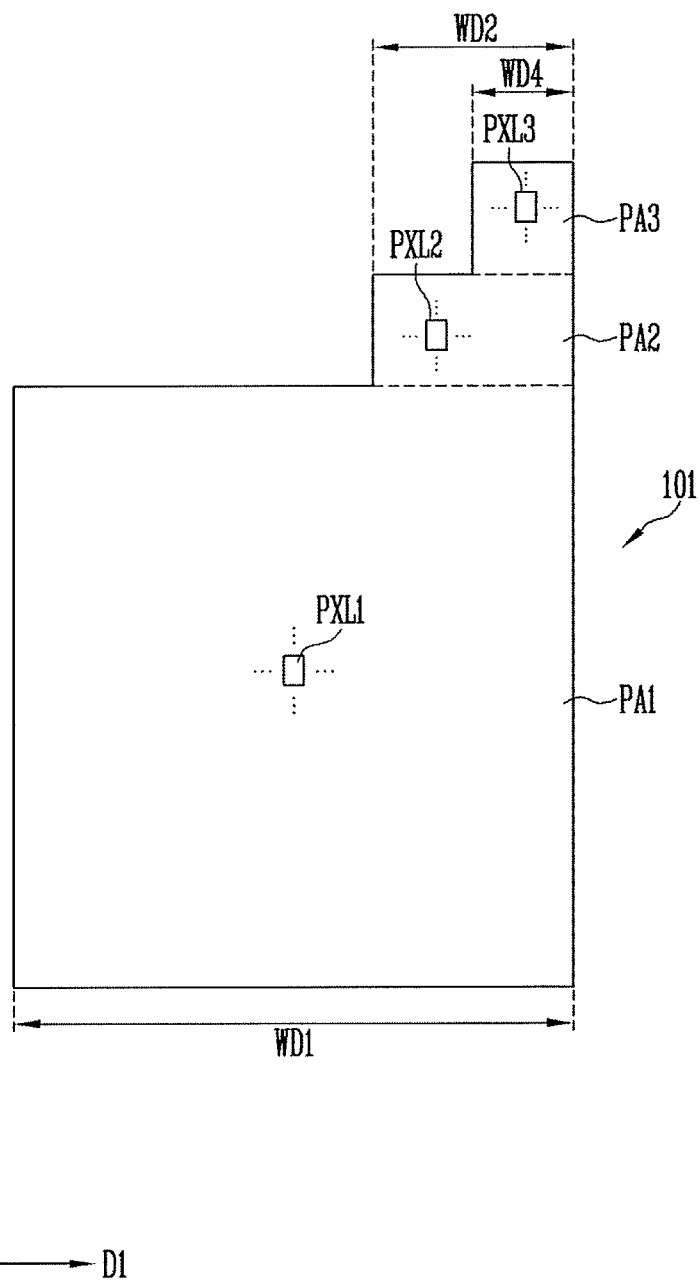

DISPLAY DEVICE

CROSS-REFERENCE TO RELATED APPLICATION

Korean Patent Application No. 10-2016-0067603, filed on May 31, 2016, in the Korean Intellectual Property Office, and entitled: "Display Device," is incorporated by reference herein in its entirety.

BACKGROUND

1. Field

An embodiment relates to a display device, and more particularly, to a display device capable of reducing a brightness difference.

2. Description of the Related Art

An organic light emitting display device includes two electrodes and an organic light emitting layer positioned between the two electrodes. Electrons implanted from one electrode are combined with holes implanted from the other electrode in the organic light emitting layer so that exciton is formed and the exciton emits light while emitting energy.

The organic light emitting display device includes a plurality of pixels including organic light emitting diodes (OLED) that are self-emitting elements. Wiring lines and a plurality of thin film transistors (TFT) are formed in each pixel.

Lengths of the wiring lines may vary in accordance with the number of pixels arranged in a horizontal direction so that the wiring lines may have different load values. When the wiring lines have the different load values, a brightness difference may be generated in the organic light emitting display device due to a difference in load value of the wiring lines.

SUMMARY

A display device according to an embodiment includes a first pixel region and a second pixel region having different widths, first pixels in the first pixel region and each including a first transistor, and second pixels in the second pixel region and each including a second transistor performing the same function as the first transistor. At least one of a channel width and a channel length of the first transistor is different from at least one of a channel width and a channel length of the second transistor.

The first pixel region is set to have a larger width than the second pixel region.

The first transistor and the second transistor are set as driving transistors and a W/L of the first transistor is smaller than a W/L of the second transistor.

The first transistor and the second transistor are set as control transistors for diode-connecting driving transistors and a mounting area of the first transistor is larger than a mounting area of the second transistor.

The display device further includes a third pixel region having a different width from the first pixel region and the second pixel region and third pixels in the third pixel region and each including a third transistor performing the same function as the first transistor.

The third pixel region has a smaller width than the second pixel region.

The first transistor, the second transistor, and the third transistor are set as driving transistors. A W/L of the first transistor is smaller than a W/L of the second transistor. A W/L of the third transistor is larger than a W/L of the second transistor.

The first transistor, the second transistor, and the third transistor are set as control transistors for diode-connecting driving transistors. A mounting area of the first transistor is larger than a mounting area of the second transistor. A mounting area of the third transistor is smaller than a mounting area of the second transistor.

The display device further includes a third pixel region set to have the same width as the second pixel region and third pixels formed in the third pixel region and each including a third transistor performing the same function as the first transistor.

A W/L of the third transistor is the same as a W/L of the second transistor.

The second transistor and the third transistor are driving transistors.

The second transistor and the third transistor are control transistors for diode-connecting driving transistors.

A width of the second pixel region gradually decreases from a first width to a second width smaller than the first width.

The second pixel region is divided into j (j is a natural number of no less than 2) regions including at least one horizontal line.

Each of the j regions includes no less than two horizontal lines and W/Ls of the second transistors positioned in the same region are set to be the same.

The second transistor is set as a driving transistor and W/Ls of the second transistors are set to vary in the j regions.

A W/L of the second transistor is set to be larger in a region having a smaller width.

The second transistor is set as a control transistor for diode-connecting driving transistors and mounting areas of the second transistors are set to vary in the j regions.

A mounting area of the second transistor is set to be smaller in a region having a smaller width.

A display device according to another embodiment includes a first pixel region and a second pixel region having different widths, first pixels formed in the first pixel region and each including a first capacitor, and second pixels formed in the second pixel region and each including a second capacitor performing the same function as the first capacitor. Capacities of the first capacitor and the second capacitor are set to vary.

The first pixel region is set to have a larger width than the second pixel region.

The first capacitor and the second capacitor are set as storage capacitors configured to store voltages of data signals and the first capacitor is set to have lower capacity than the second capacitor.

The first capacitor and the second capacitor are set as boosting capacitors positioned between a scan line and a driving transistor and the first capacitor is set to have higher capacity than the second capacitor.

A display device according to another embodiment includes first pixels positioned in a first pixel region having a first width and second pixels positioned in a second pixel region having a second width different from the first width. Each of the first pixels and the second pixels includes an organic light emitting diode (OLED), a first transistor configured to control an amount of current that flows from a first power source connected to a first electrode to a second power source via the OLED, and a second transistor connected between a data line and the first electrode of the first transistor. At least one of a channel width and a channel length of the first transistor included in the first pixel is set to be different from at least one of a channel width and a channel length of the first transistor included in the second pixel.

The first width is set to have a larger width than the second width.

A W/L of the first transistor included in the first pixel is set to be smaller than a W/L of the first transistor included in the second pixel.

Each of the first pixels and the second pixels further includes a third transistor connected between a gate electrode of the first transistor and a second electrode of the first transistor.

A mounting area of the third transistor included in the first pixel is set to be larger than a mounting area of the third transistor included in the second pixel.

Each of the first pixels and the second pixels further includes a boosting capacitor connected between a scan line and the gate electrode of the first transistor.

The boosting capacitor included in the first pixel is set to have higher capacity than the boosting capacitor included in the second pixel.

Each of the first pixels and the second pixels further includes a storage capacitor connected between the gate electrode of the first transistor and the first power source.

The storage capacitor included in the first pixel is set to have lower capacity than the storage capacitor included in the second pixel.

BRIEF DESCRIPTION OF THE DRAWINGS

Features will become apparent to those of ordinary skill in the art by describing in detail exemplary embodiments with reference to the attached drawings in which:

FIG. 2 illustrates a view of a substrate according to another embodiment;

DETAILED DESCRIPTION

Figure 1A:
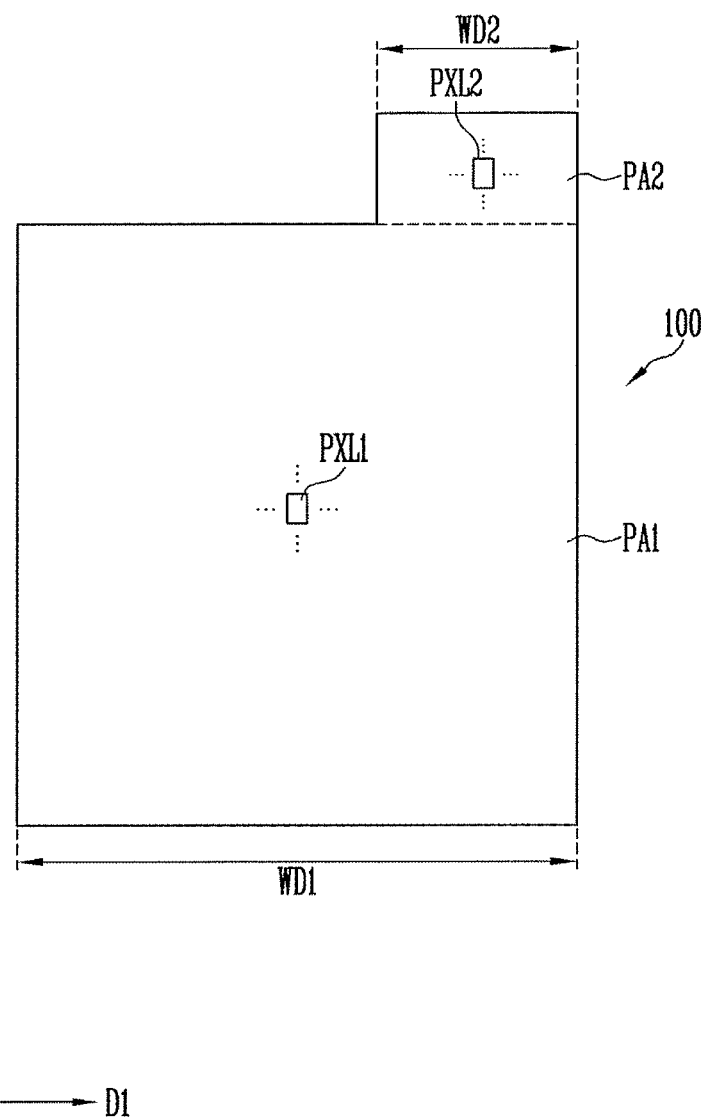
FIGS. 1A and 1B illustrate views of a substrate according to embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will full convey the scope of the example embodiments to those skilled in the art.

It will be understood that when an element is referred to as being "between" two elements, it can be the only element between the two elements, or one or more intervening elements may also be present. Like reference numerals refer to like elements throughout.

Figure 1B:
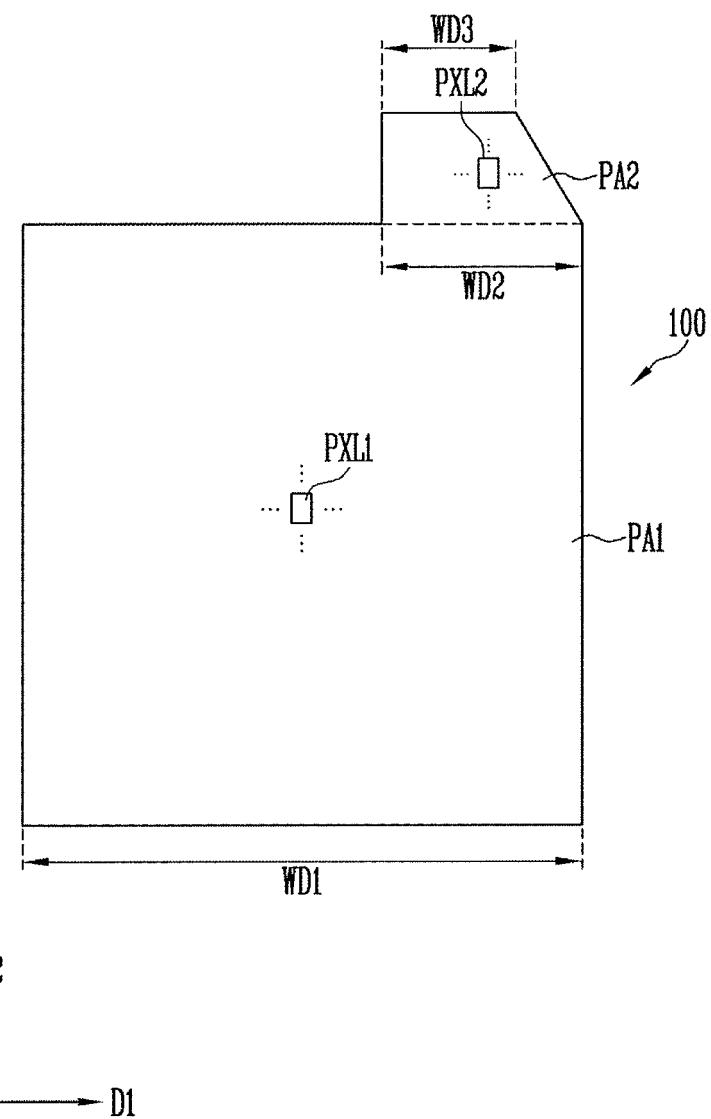

FIGS. 1A and 1B are views illustrating a substrate 100 according to embodiments.

Referring to FIG. 1A, the substrate 100 according to an embodiment includes a first pixel region PA1 with a first width WD1 and a second pixel region PA2 with a second width WD2, i.e., an extent in a first direction D1. Here, the second width WD2 is set to be smaller than the first width WD1. The first pixel region PA1 may have a larger area than the second pixel region PA2, i.e., the second pixel region PA2 may extend in a second direction D2 for less than or equal to the extent in the second direction D2 of the first pixel region PA1.

According to an embodiment, a width is determined by the number of pixels arranged in a horizontal direction, i.e., the first direction, of a corresponding pixel region. Therefore, a smaller number of pixels may be included on a horizontal line of the second pixel region PA2 than on a horizontal line of the first pixel region PA1.

First pixels PXL1 are formed in the first pixel region PA1 with the first width WD1. The first pixels PXL1 display a predetermined image in the first pixel region PA1. Second pixels PXL2 are formed in the second pixel region PA2 with the second width WD2. The second pixels PXL2 display a predetermined image in the second pixel region PA2.

The second pixel region PA2 may be positioned at one side of the first pixel region PA1. For example, the second pixel region PA2 may protrude from a partial upper region of the first pixel region PA1, i.e., may extend from the first pixel region PA1 along the second direction D2 and may be aligned with an edge of the first pixel region PA1 along the second direction D2, e.g., right hand edges of the first pixel region and the second pixel region may be aligned along the first direction D1.

Alternatively, the second pixel region PA2 with the second width WD2 may be formed in various positions adjacent to the first pixel region PA1. For example, the second pixel region PA2 may protrude from a partial lower region of the first pixel region PA1, e.g., along the second direction, or may protrude from either side of the first pixel region PA1, e.g., along the first direction.

In addition, as illustrated in FIG. 1B, at least a partial side including a corner of the second pixel region PA2 may be oblique, i.e., may be slanted to form an oblique angle with both of the first and second directions. At least a partial region of the second pixel region PA2 may have a third width WD3 smaller than the second width WD2. For example, the width of the second pixel region PA2 may be gradually reduced from the second width WD2 to the third width WD3. When the width of the second pixel region PA2 is gradually reduced from the second width WD2 to the third width WD3, the number of second pixels PXL2 may be vary in units of at least one horizontal line. For example, more second pixels PXL2 may be arranged in a horizontal line in the second pixel region PA2 that is closer to the first pixel region PA1.

Alternatively, the at least partial side including the corner of the second pixel region PA2 may be oblique or may have another shape. For example, the at least partial side including the corner of the second pixel region PA2 may be curved with a predetermined curvature. At least a partial side including a corner of the first pixel region PA1 may be oblique or curved.

The substrate 100 may be formed of an insulating material, e.g., glass, resin, and so forth. Alternatively, the substrate 100 may be formed of a flexible material so as to be curved or bent, and may have a single layer structure or a multilayer structure. For example, the substrate 100 may include at least one of polystyrene, polyvinyl alcohol (PVA), poly(methyl methacrylate) (PMMA), polyethersulfone (PES), polyacrylate, polyetherimide (PEI), polyethylene naphthalate (PEN), polyethylene terephthalate (PET), polyphenylene sulfide (PPS), polyarylate, polyimide (PI), polycarbonate (PC), triacetate cellulose (TAC), and celluloseacetate propionate (CAP). The substrate 100 may be formed of various materials such as fiber glass reinforced plastic (FRP).

FIG. 2 is a view illustrating a substrate according to another embodiment. Referring to FIG. 2, the substrate 101 according to the embodiment includes a first pixel region PA1 with a first width WD1, a second pixel region PA2 with a second width WD2, and a third pixel region PA3 with a fourth width WD4. Here, the fourth width WD4 is smaller than the second width WD2 and the second width WD2 is set to be smaller than the first width WD1. In this case, the first pixel region PA1 may have a larger area than the second pixel region PA2 and the second pixel region PA2 may have a larger area than the third pixel region PA3.

First pixels PXL1 are formed in the first pixel region PA1 with the first width WD1. The first pixels PXL1 display a predetermined image in the first pixel region PA1.

Second pixels PXL2 are formed in the second pixel region PA2 with the second width WD2. The second pixels PXL2 display a predetermined image in the second pixel region PA2.

Third pixels PXL3 are formed in the third pixel region PA3 with the fourth width WD4. The third pixels PXL3 display a predetermined image in the third pixel region PA3.

The second pixel region PA2 may be positioned at one side of the first pixel region PA1. For example, the second pixel region PA2 may protrude from a partial upper region of the first pixel region PA1. In addition, the second pixel region PA2 with the second width WD2 may be formed in various positions so as to be adjacent to the first pixel region PA1.

The third pixel region PA3 may be positioned at one side of the second pixel region PA2. For example, the third pixel region PA3 may protrude from a partial upper region of the second pixel region PA2. In addition, the third pixel region PA3 with the fourth width WD4 may be formed in various positions so as to be adjacent to the first pixel region PA1 or the second pixel region PA2. For example, the first to third pixel regions may have right edges thereof extending along the second direction D2 aligned along the first direction D1.

Alternatively, at least a partial side including corners/a corner of the first pixel region PA1, the second pixel region PA2, and/or the third pixel region PA3 may be oblique or curved, as discussed in connection with FIG. 1B.

Figure 3:
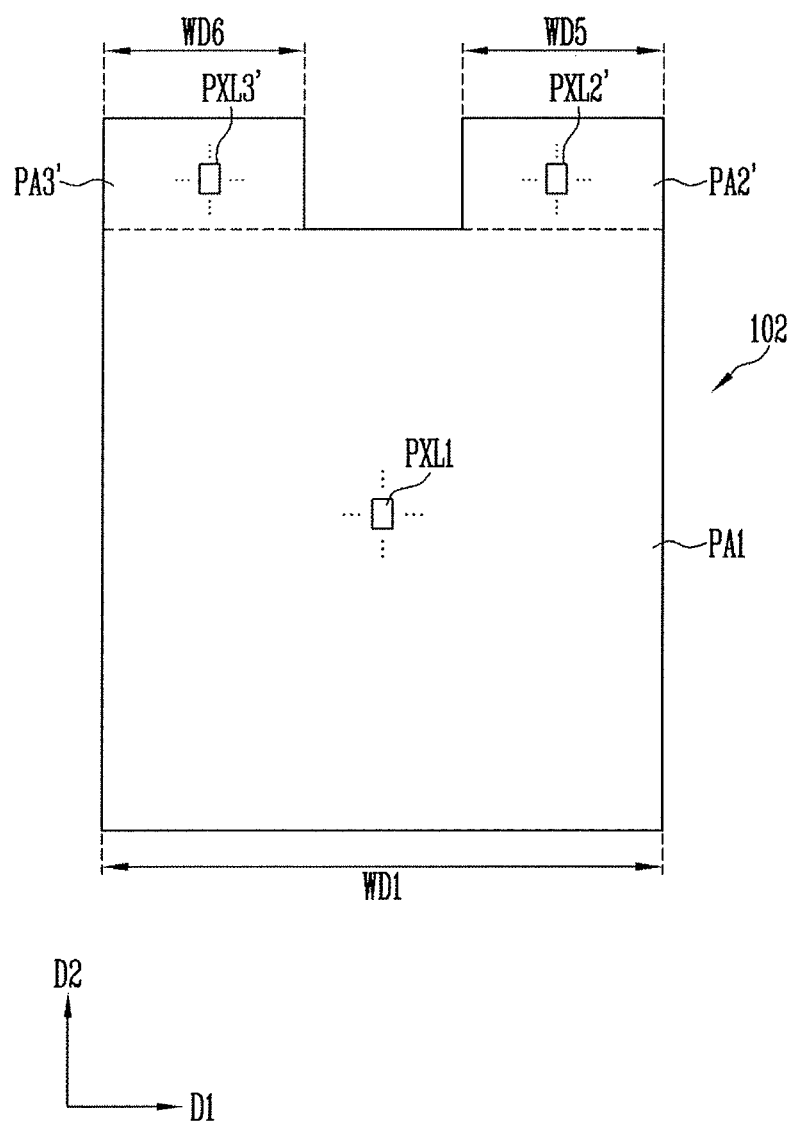
FIG. 3 illustrates a view of a substrate according to another embodiment.

FIG. 3 is a view illustrating a substrate according to another embodiment. Referring to FIG. 3, the substrate 102 according to another embodiment includes a first pixel region PA1 with a first width WD1, a second pixel region PA2' with a fifth width WD5, and a third pixel region PA3' with a sixth width WD6. Here, the fifth width WD5 and the sixth width WD6 are smaller than the first width WD1, and may be equal to or different from each other. In this case, the first pixel region PA1 may have a larger area than those of the second pixel region PA2' and the third pixel region PA3'.

First pixels PXL1 are formed in the first pixel region PA1 with the first width WD1. The first pixels PXL1 display a predetermined image in the first pixel region PA1.

Second pixels PXL2' are formed in the second pixel region PA2' with the fifth width WD5. The second pixels PXL2' display a predetermined image in the second pixel region PA2'.

Third pixels PXL3' are formed in the third pixel region PA3' with the sixth width WD6. The third pixels PXL3' display a predetermined image in the third pixel region PA3'.

The second pixel region PA2' and the third pixel region PA3' may be positioned at respective sides of the first pixel region PA1. For example, the second pixel region PA2' protrudes from the upper right side of the first pixel region PA1 and the third pixel region PA3' may protrude from the upper left side of the first pixel region PA1, both protruding along the first direction S1. For example, the second pixel region PA2' may extend along the second direction D2 with the right hand side of the first pixel region PA1 and aligned along the first direction D1, while the third pixel region PA3' may extend along the second direction D2 with the left hand side of the first pixel region PA1 and aligned along the first direction D1.

Alternatively, the second pixel region PA2' and the third pixel region PA3' may be formed in various positions adjacent to the first pixel region PA1. For example, the second pixel region PA2' may protrude from the lower right side of the first pixel region PA1 and the third pixel region PA3' may protrude from the lower left side of the first pixel region PA1, both along the first direction, or both may protrude from a same side of the first pixel region PA1, e.g., along the first direction. Additionally or alternatively, at least a partial side including corners/a corner of the first pixel region PA, the second pixel region PA2, and/or the third pixel region PA3 may be oblique or curved.

Figure 4:
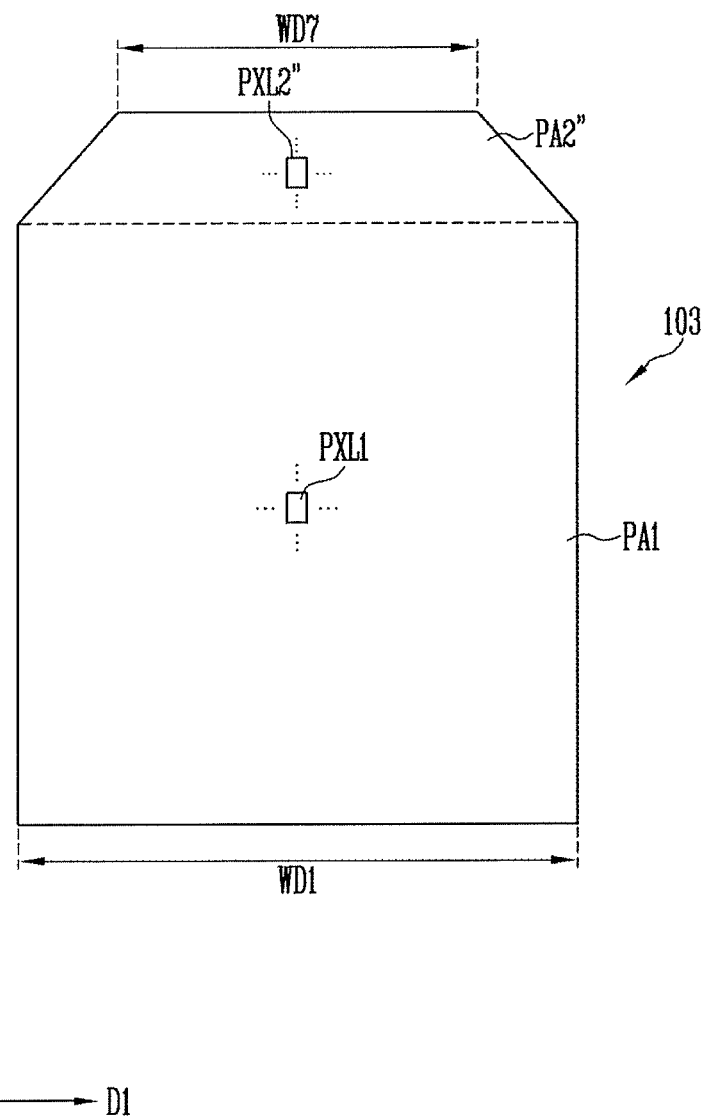
FIG. 4 illustrates a view of a substrate according to another embodiment.

FIG. 4 is a view illustrating a substrate according to another embodiment. Referring to FIG. 4, the substrate 103 according to another embodiment includes a first pixel region PA1 with a first width WD1 and a second pixel region PA2" with at least a partial region having a seventh width WD7. Here, the seventh width WD7 is set to be smaller than the first width WD1. In this case, the first pixel region PA1 may have a larger area than the second pixel region PA2".

First pixels PXL1 are formed in the first pixel region PA1 with the first width WD1. The first pixels PXL1 display a predetermined image in the first pixel region PA1.

The width of the second pixel region PA2" may be gradually reduced from the first width WD1 to the seventh width WD7. In this case, the number of second pixels PXL2" formed in the second pixel region PA2" may vary in units of at least one horizontal line. For example, more second pixels PXL2" may be arranged on a horizontal line in the second pixel region PA2" closer to the first pixel region PA1. In addition, in FIG. 4, it is illustrated that the width of the second pixel region PA2" is reduced so that the second pixel region PA2" is oblique. However, the embodiments are not limited thereto. For example, the width of the second pixel region PA2" may be reduced so that the second pixel region PA2" is curved.

In addition, in FIG. 4, the second pixel region PA2" is illustrated as being arranged on top of the first pixel region PA1. However, embodiments are not limited thereto. For example, the second pixel region PA2" is arranged under the first pixel region PA1, may be arranged under and on the first pixel region PA1, and/or may be arranged one or both sides of the first pixel region PA1.

The above-described first through seventh widths WD1 through WD7 used for describing FIGS. 1 through 4 may vary to correspond to sizes of the substrates. In addition, the fifth width WD5, the sixth width WD6, and the seventh width WD7 may be equal to or different from the second through fourth widths WD2 through WD4.

Figure 5:
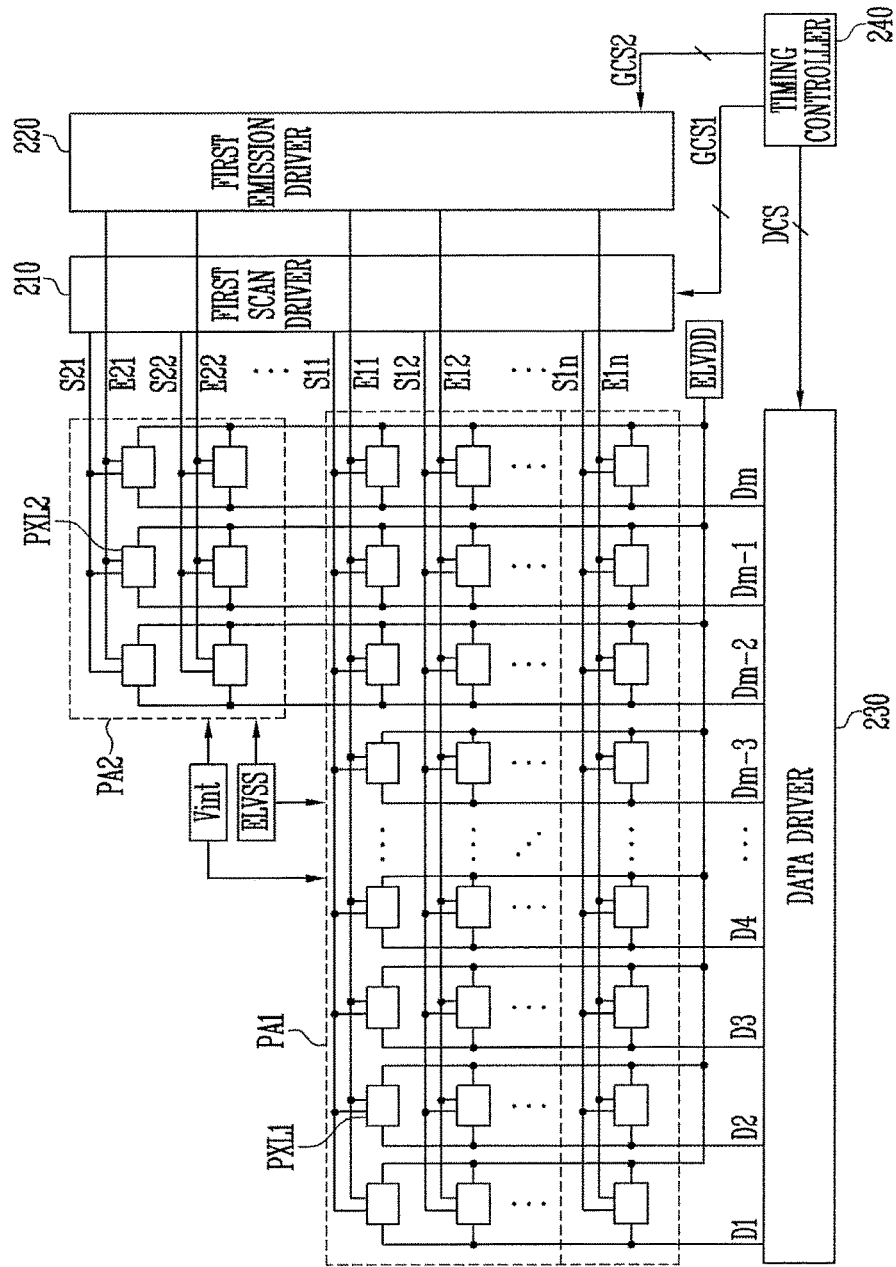
FIG. 5 illustrates a view of an embodiment of an organic light emitting display device corresponding to the substrate of FIG. 1A.

FIG. 5 is a view illustrating an embodiment of an organic light emitting display device corresponding to the substrate of FIG. 1A. Referring to FIG. 5, the organic light emitting display device according to the embodiment includes a first scan driver 210, a first emission driver 220, a data driver 230, a timing controller 240, and the first pixels PXL1 and the second pixels PXL2.

The first pixels PXL1 in the first pixel region PA1 are connected to first scan lines S11 through Sin, first emission control lines E11 through E1n, and data lines D1 through Dm. The first pixels PXL1 receive data signals from the data lines D1 through Dm when scan signals are supplied from the first scan lines S11 through Sin. The first pixels PXL1 that receive the data signals control an amount of current that flows from a first power source ELVDD to a second power source ELVSS via organic light emitting diodes (OLED).

The second pixels PXL2 in the second pixel region PA2 are connected to second scan lines S21 and S22, second emission control lines E21 and E22, and data lines Dm-2 through Dm. The second pixels PXL2 receive data signals from the data lines Dm-2 through Dm when scan signals are supplied from the second scan lines S21 and S22. The second pixels PXL2 that receive the data signals control an amount of current that flows from the first power source ELVDD to the second power source ELVSS via the OLEDs.

In addition, in FIG. 5, it is illustrated that the six second pixels PXL2 are arranged in the second pixel region PA2 by the two second scan lines S21 and S22, the two second emission control lines E21 and E22, and the three data lines Dm-2 through Dm. However, embodiments are not limited thereto. That is, the plurality of second pixels PXL2 are arranged to correspond to the width of the second pixel region PA2 and the number of second scan lines S2, second emission control lines E2, and data lines D may correspond to the second pixels PXL2.

In addition, to correspond to a circuit structure of the second pixels PXL2, at least one dummy scan line and dummy emission control line may be additionally formed in the second pixel region PA2. To correspond to a circuit structure of the first pixels PXL1, at least one dummy scan line and dummy emission control line may be additionally formed in the first pixel region PA1.

The first scan driver 210 supplies scan signals to the second scan lines S2 and the first scan lines S1 in response to a first gate control signal GCS1 from the timing controller 240. For example, the first scan driver 210 may sequentially supply the scan signals to the second scan lines S2 and the first scan lines S1. When the scan signals are sequentially supplied to the second scan lines S2 and the first scan lines S1, the second pixels PXL2 and the first pixels PXL1 are sequentially selected in units of horizontal lines.

The first scan driver 210 may be mounted on the substrate 100 by a thin film process. In addition, the first scan driver 210 may be mounted on both sides of the substrate 100 with the first pixel region PA1 and the second pixel region PA2 interposed. The first pixel region PA1 and the second pixel region PA2 may be driven by different scan drivers.

The first emission driver 220 supplies emission control signals from the second emission control lines E2 to the first emission control lines E1 in response to a second gate control signal GCS2 from the timing controller 240. For example, the first emission driver 220 may sequentially supply the emission control signals to the second emission control lines E2 and the first emission control lines E1. The emission control signals are used for controlling emission time of the pixels PXL1 and PXL2. For this purpose, the emission control signals may have larger widths than those of the scan signals. In addition, the scan signals are set to have gate on voltages so that transistors included in the pixels PXL1 and PXL2 may be turned on and the emission control signals may have gate off voltages so that the transistors included in the pixels PXL1 and PXL2 may be turned off.

The first emission driver 220 may be mounted on the substrate 100 by a thin film process. In addition, the first emission driver 220 may be mounted on both sides of the substrate 100 with the first pixel region PA1 and the second pixel region PA2 interposed. The first pixel region PA1 and the second pixel region PA2 may be driven by different emission drivers.

The data driver 230 supplies the data signals to the data lines D1 through Dm in response to data control signals DCS from the timing controller 240. The data signals supplied to the data lines D1 through Dm are supplied to the pixels PXL1 and PXL2 selected by the scan signals. Here, the data driver 230 is illustrated as being arranged below the first pixel region PA1. However, embodiments are not limited thereto. For example, the data driver 230 may be arranged above the first pixel region PA1.

The timing controller 240 supplies first gate control signals GCS1, second gate control signals GCS2, and the data control signals DCS generated based on timing signals supplied from the outside to the first scan driver 210, the first emission driver 220, and the data driver 230.

A start pulse and clock signals are included in each of the gate control signals GCS1 and GCS2. The start pulse controls timing of the first scan signal or the first emission control signal. The clock signals are used for shifting the start pulse.

A source start pulse and clock signals are included in the data control signals DCS. The source start pulse controls a sampling start point of time of data. The clock signals are used for controlling a sampling operation.

According to an embodiment, a ratio of a channel length L to a channel width W (hereinafter, referred to as W/L) of at least one specific transistor included in each of the first pixels PXL1 and the second pixels PXL2 and performing the same function of at least one specific transistor and/or a capacity of at least one specific capacitor included in each of the first pixels PXL1 and the second pixels PXL2 and performing the same function are different so that brightness differences between the first and second pixel regions PA1 and PA2 may be compensated.

Figure 6:
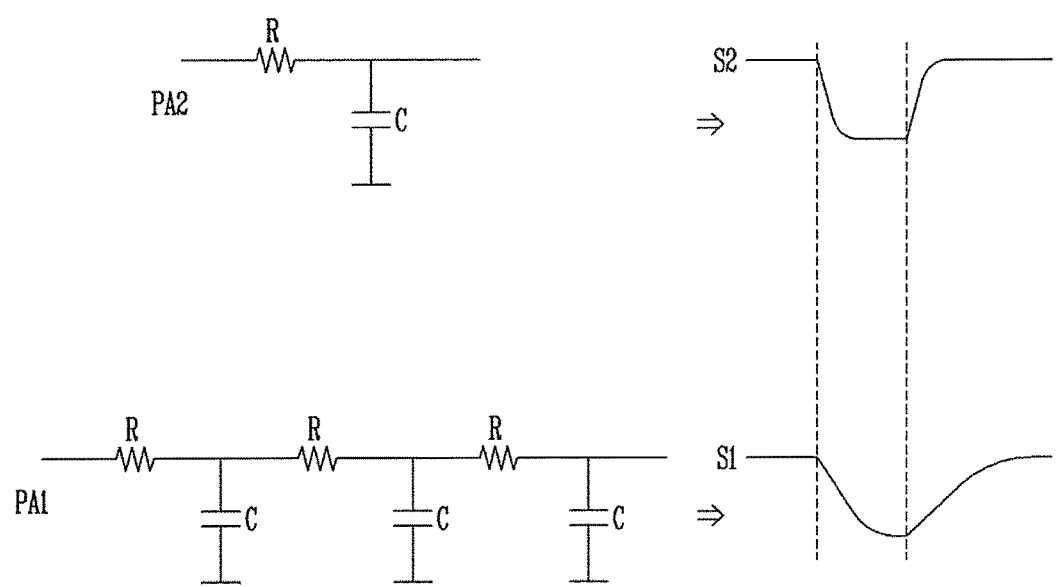
FIG. 6 illustrates a view of RC load values of the pixel regions of FIG. 5.

When the first pixels PXL1 are positioned in the first pixel region PA1 with the first width WD1 and the second pixels PXL2 are positioned in the second pixel region PA2 with the second width WD2, as illustrated in FIG. 6, an RC load of the first scan lines S1 positioned in the first pixel region PA1 an RC load of the second scan lines S2 positioned in the second pixel region PA2 differ. That is, the scan signals supplied to the first scan lines S1 have larger delay than the scan signals supplied to the second scan lines S2 due to the different widths of the regions.

Therefore, when data signals having the same voltage are supplied, a first voltage is stored in the first pixels PXL1 and a second voltage, higher than the first voltage is stored, in the second pixels PXL2. In this case, although data signals having the same grayscale are supplied, a brightness difference is generated between the first pixel region PA1 and the second pixel region PA2. For example, when the pixels PXL1 and PXL2 are formed of p-channel metal-oxide-semiconductor field effect transistor (MOSFETs) (PMOS), in response to the data signals having the same grayscale, a darker screen is displayed in the second pixel region PA2 than in the first pixel region PA1.

According to an embodiment, the W/L of the at least one specific transistor included in each of the first pixels PXL1 and the second pixels PXL2 and performing the same function and/or the capacity of the at least one specific capacitor included in each of the first pixels PXL1 and the second pixels PXL2 and performing the same function are set to vary so that the brightness difference may be compensated for.

A configuration of the organic light emitting display device corresponding to the substrate of FIG. 1B is set to be the same as that of FIG. 1A except for the number of second pixels PXL2 formed in each horizontal line of the second pixel region PA2. Therefore, detailed description of the organic light emitting display device corresponding to the substrate of FIG. 1B will not be given.

Figure 7:
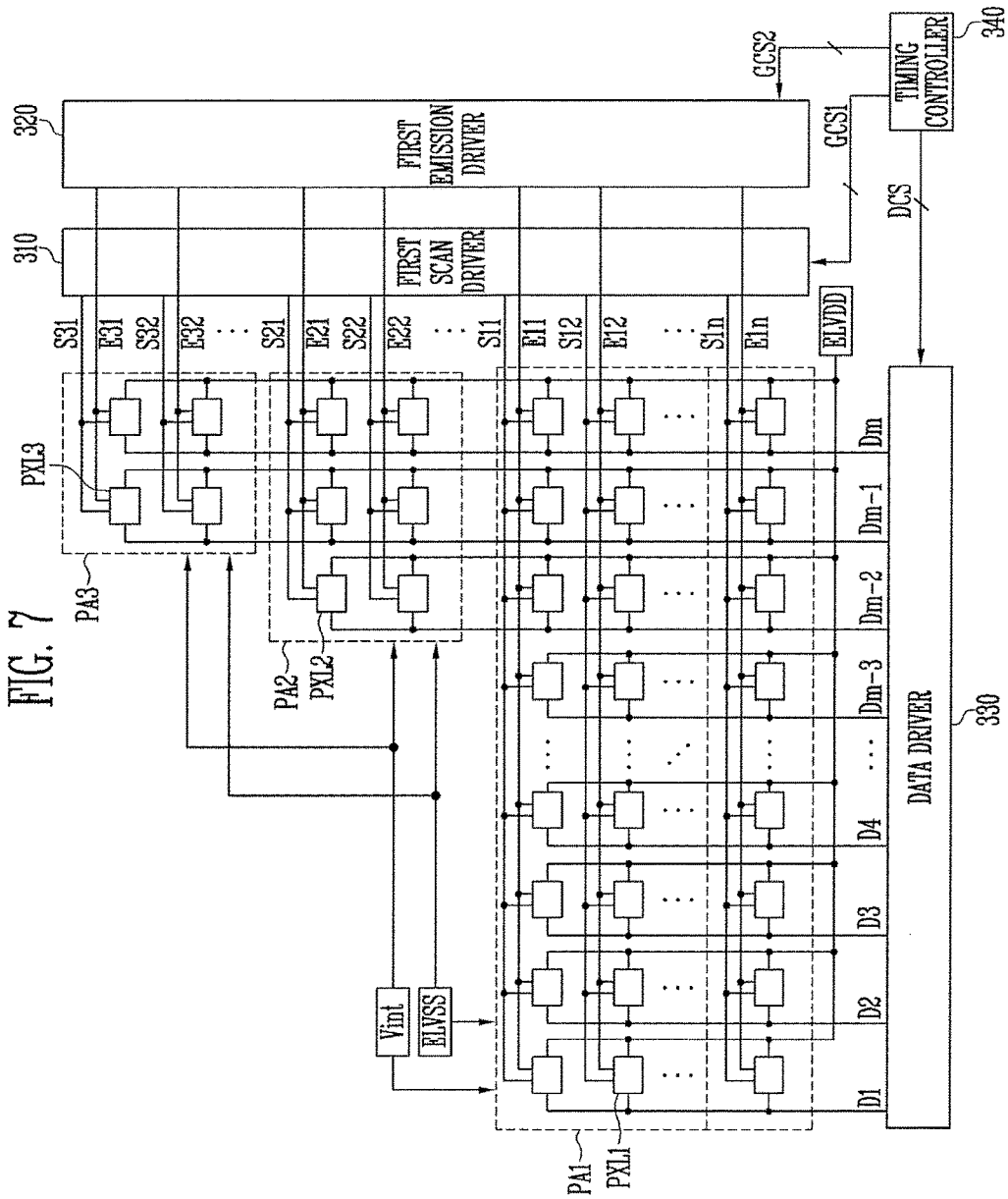
FIG. 7 illustrates a view of an embodiment of an organic light emitting display device corresponding to the substrate of FIG. 2.

FIG. 7 is a view illustrating an embodiment of an organic light emitting display device corresponding to the substrate of FIG. 2. Referring to FIG. 7, the organic light emitting display device according to another embodiment includes a first scan driver 310, a first emission driver 320, a data driver 330, a timing controller 340, first pixels PXL1, second pixels PXL2, and third pixels PXL3.

The first pixels PXL1 in the first pixel region PA1 are connected to the first scan lines S11 through S1n, the first emission control lines E11 through E1n, and the data lines D1 through Dm. The first pixels PXL1 receive data signals from the data lines D1 through Dm when scan signals are supplied from the first scan lines S11 through S1n. The first pixels PXL1 that receive the data signals control an amount of current that flows from a first power source ELVDD to a second power source ELVSS via OLEDs.

The second pixels PXL2 in the second pixel region PA2 are connected to the second scan lines S21 and S22, second emission control lines E21 and E22, and data lines Dm-2 through Dm. The second pixels PXL2 receive the data signals from the data lines Dm-2 through Dm when the scan signals are supplied to the second scan lines S21 and S22. The second pixels PXL2 that receive the data signals control the amount of current that flows from the first power source ELVDD to the second power source ELVSS via the OLEDs.

In addition, in FIG. 7, it is illustrated that the six second pixels PXL2 are arranged in the second pixel region PA2 by the two second scan lines S21 and S22, the two second emission control lines E21 and E22, and the three data lines Dm-2 through Dm. However, embodiments are not limited thereto. That is, the plurality of second pixels PXL2 are arranged to correspond to the width of the second pixel region PA2 and the number of second scan lines S2, second emission control lines E2, and data lines D may correspond to the second pixels PXL2.

The third pixels PXL3 in the third pixel region PA3 are connected to the third scan lines S31 and S32, third emission control lines E31 and E32, and data lines Dm-1 through Dm. The third pixels PXL3 receive the data signals from the data lines Dm-1 through Dm when the scan signals are supplied to the third scan lines S31 and S32. The third pixels PXL3 that receive the data signals control the amount of current that flows from the first power source ELVDD to the second power source ELVSS via the OLEDs.

In addition, in FIG. 7, it is illustrated that the four third pixels PXL3 are arranged in the third pixel region PA3 by the two third scan lines S31 and S32, the two third emission control lines E31 and E32, and the two data lines Dm-1 and Dm. However, embodiments are not limited thereto. That is, the plurality of third pixels PXL3 are arranged to correspond to the width of the third pixel region PA3 and the number of third scan lines S3, third emission control lines E3, and data lines D may correspond to the third pixels PXL3.

In addition, to correspond to circuit structures of the first pixels PXL1, the second pixels PXL2, and the third pixels PXL3, at least one dummy scan line and dummy emission control line may be additionally formed in the first pixel region PA1, the second pixel region PA2, and the third pixel region PA3.

The first scan driver 310 supplies scan signals to the third scan lines S3, the second scan lines S2, and the first scan lines S1 in response to the first gate control signal GCS1 from the timing controller 340. For example, the first scan driver 310 may sequentially supply the scan signals to the third scan lines S3, the second scan lines S2, and the first scan lines S1. When the scan signals are sequentially supplied to the third scan lines S3, the second scan lines S2, and the first scan lines S1, the third pixels PXL3, the second pixels PXL2, and the first pixels PXL1 are sequentially selected in units of horizontal lines.

The first scan driver 310 may be mounted on the substrate 101 by a thin film process. In addition, the first scan driver 310 may be mounted on both sides of the substrate 101 with the first pixel region PA1, the second pixel region PA2, and the third pixel region PA3 interposed. The first pixel region PA1, the second pixel region PA2, and/or the third pixel region PA3 may be driven by different scan drivers.

The first emission driver 320 supplies emission control signals from the third emission control lines E3, the second emission control lines E2, and the first emission control lines E1 in response to the second gate control signal GCS2 from the timing controller 240. For example, the first emission driver 320 may sequentially supply the emission control signals to the third emission control lines E3, the second emission control lines E2, and the first emission control lines E1.

The first emission driver 320 may be mounted on the substrate 101 by a thin film process. In addition, the first emission driver 320 may be mounted on both sides of the substrate 101 with the first pixel region PA1, the second pixel region PA2, and the third pixel region PA3 interposed. The first pixel region PA1, the second pixel region PA2, and the third pixel region PA3 may be driven by different emission drivers.

The data driver 330 supplies the data signals to the data lines D1 through Dm in response to data control signals DCS from the timing controller 340. The data signals supplied to the data lines D1 through Dm are supplied to the pixels PXL1, PXL2, and PXL3 selected by the scan signals.

Here, the data driver 330 is illustrated as being arranged below the first pixel region PA1. However, embodiments are not limited thereto. For example, the data driver 330 may be arranged above the first pixel region PA1.

The timing controller 340 supplies first gate control signals GCS1, second gate control signals GCS2, and the data control signals DCS generated based on timing signals supplied from the outside to the first scan driver 310, the first emission driver 320, and the data driver 330.

On the other hand, according to the present embodiment, a W/L of at least one specific transistor included in each of the first pixels PXL1, the second pixels PXL2, and the third pixels PXL3 and performing the same function and/or capacity of at least one specific capacitor included in each of the first pixels PXL1, the second pixels PXL2, and the third pixels PXL3 and performing the same function are set to vary so that brightness differences between the first to third pixel regions PA1, PA2, and PA3 may be compensated.

Specifically, the first pixels PXL1 are in the first pixel region PA1 with the first width WD1, the second pixels PXL2 are in the second pixel region PA2 with the second width WD2, and the third pixels PXL3 are in the third pixel region PA3 with the fourth width WD4.

Therefore, an RC load of the first scan lines S1 in the first pixel region PA1, an RC load of the second scan lines S2 in the second pixel region PA2, and an RC load of the third scan lines S3 in the third pixel region PA3 vary. In this case, when data signals having the same voltage are supplied, a first voltage is stored in the first pixels PXL1, a second voltage higher than the first voltage is stored in the second pixels PXL2, and a third voltage higher than the second voltage is stored in the third pixels PXL3.

That is, although data signals having the same grayscale are supplied, different voltages are respectively stored in the first pixels PXL1, the second pixels PXL2, and the third pixels PXL3, so that brightness differences are generated among the first pixel region PA1, the second pixel region PA2, and the third pixel region PA3. For example, when the pixels PXL1, PXL2, and PXL3 are formed of PMOS, in response to the data signals having the same grayscale, a darker screen is displayed in the second pixel region PA2 than in the first pixel region PA1 and a darker screen is displayed in the third pixel region PA3 than in the second pixel region PA2.

According to the embodiment, the W/L of the at least one specific transistor included in each of the first pixels PXL1, the second pixels PXL2, and the third pixels PXL3 and performing the same function and/or the capacity of the at least one specific capacitor included in each of the first pixels PXL1, the second pixels PXL2, and the third pixels PXL3 and performing the same function differ so that the brightness differences may be compensated. In addition, the above-described first through third voltages represent relative magnitudes of the voltages and are not limited to specific voltages.

Figure 8:
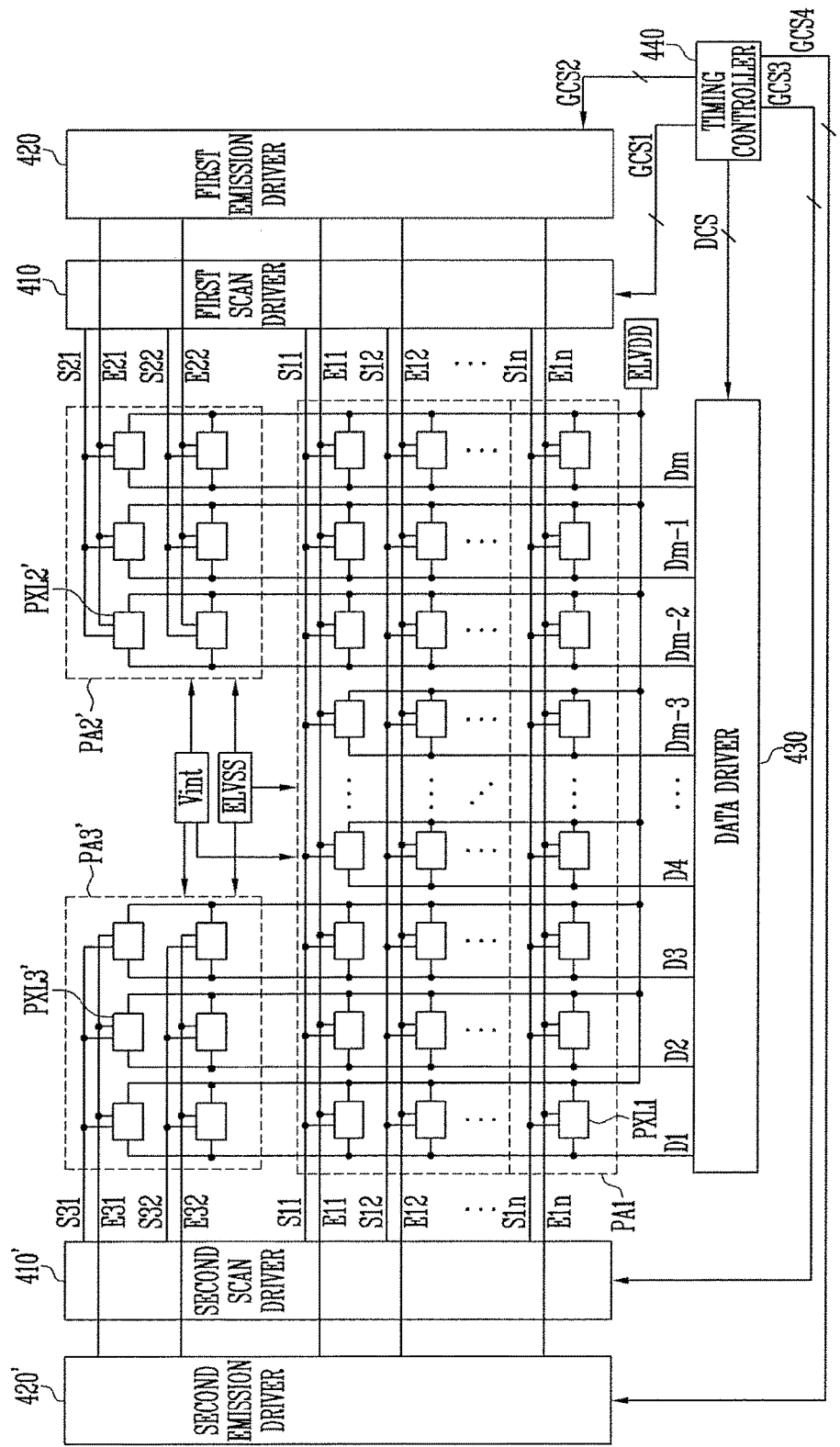
FIG. 8 illustrates a view of an embodiment of an organic light emitting display device corresponding to the substrate of FIG. 3.

FIG. 8 is a view illustrating an embodiment of an organic light emitting display device corresponding to the substrate of FIG. 3. Referring to FIG. 8, the organic light emitting display device according to another embodiment includes a first scan driver 410, a first emission driver 420, a second scan driver 410', a second emission driver 420', a data driver 430, a timing controller 440, first pixels PXL1, second pixels PXL2', and third pixels PXL3'.

The first pixels PXL1 in the first pixel region PA1 are connected to the first scan lines S11 through S1n, the first emission control lines E11 through E1n, and the data lines D1 through Dm. The first pixels PXL1 receive data signals from the data lines D1 through Dm when scan signals are supplied from the first scan lines S11 through S1n. The first pixels PXL1 that receive the data signals control an amount of current that flows from a first power source ELVDD to a second power source ELVSS via OLEDs.

The second pixels PXL2' in the second pixel region PA2' are connected to the second scan lines S21 and S22, second emission control lines E21 and E22, and data lines Dm-2 through Dm. The second pixels PXL2' receive the data signals from the data lines Dm-2 through Dm when the scan signals are supplied to the second scan lines S21 and S22. The second pixels PXL2' that receive the data signals control the amount of current that flows from the first power source ELVDD to the second power source ELVSS via the OLEDs. Here, the number of second pixels PXL2' arranged to correspond to a width of the second pixel region PA2' may vary and the number of second scan lines S2, second emission control lines E2, and data lines D may vary to correspond to the second pixels PXL2'.

The third pixels PXL3' in the third pixel region PA3' are connected to the third scan lines S31 and S32, third emission control lines E31 and E32, and data lines D1 through D3. The third pixels PXL3' receive the data signals from the data lines D1 through D3 when the scan signals are supplied to the third scan lines S31 and S32. The third pixels PXL3' that receive the data signals control the amount of current that flows from the first power source ELVDD to the second power source ELVSS via the OLEDs. Here, the number of third pixels PXL3' arranged to correspond to a width of the third pixel region PA3' may vary and the number of third scan lines S3, third emission control lines E3, and data lines D may vary to correspond to the third pixels PXL3'.

In addition, to correspond to circuit structures of the first pixels PXL1, the second pixels PXL2', and the third pixels PXL3', at least one dummy scan line and dummy emission control line may be additionally formed in the first pixel region PA1, the second pixel region PA2', and the third pixel region PA3'.

The first scan driver 410 supplies scan signals to the second scan lines S2 and the first scan lines S1 in response to the first gate control signal GCS1 from the timing controller 440. For example, the first scan driver 410 may sequentially supply the scan signals to the second scan lines S2 and the first scan lines S1. When the scan signals are sequentially supplied to the second scan lines S2 and the first scan lines S1, the second pixels PXL2' and the first pixels PXL1 are sequentially selected in units of horizontal lines.

In FIG. 8, the second pixel region PA2' and the first pixel region PA1 are driven by the same scan driver 410. However, embodiments are not limited thereto. For example, the second pixel region PA2' and the first pixel region PA1 may be driven by different scan drivers.

The first emission driver 420 supplies emission control signals to the second emission control lines E2 and the first emission control lines E1 in response to the second gate control signal GCS2 from the timing controller 440. For example, the first emission driver 420 may sequentially supply the emission control signals to the second emission control lines E2 and the first emission control lines E1.

In FIG. 8, the second pixel region PA2' and the first pixel region PA1 are driven by the same emission driver 420. However, embodiments are not limited thereto. For example, the second pixel region PA2' and the first pixel region PA1 may be driven by different emission drivers.

The second scan driver 410' supplies the scan signals to the third scan lines S3 and the first scan lines S1 in response to a third gate control signal GCS3 from the timing controller 440. For example, the second scan driver 410' may sequentially supply the scan signals to the third scan lines S3 and the first scan lines S1. When the scan signals are sequentially supplied to the third scan lines S3 and the first scan lines S1, the third pixels PXL3' and the first pixels PXL1 are sequentially selected in units of horizontal lines.

In FIG. 8, the third pixel region PA3' and the first pixel region PA1 are driven by the same scan driver 410'. However, embodiments are not limited thereto not limited thereto. For example, the third pixel region PA3' and the first pixel region PA1 may be driven by different scan drivers.

The second emission driver 420' supplies the emission control signals to the third emission control lines E3 and the first emission control lines E1 in response to a fourth gate control signal GCS4 from the timing controller 440. For example, the second emission driver 420' may sequentially supply the emission control signals to the third emission control lines E3 and the first emission control lines E1.

In FIG. 8, the third pixel region PA3' and the first pixel region PA1 are driven by the same emission driver 420'. However, embodiments are not limited thereto not limited thereto. For example, the third pixel region PA3' and the first pixel region PA1 may be driven by different emission drivers.

The data driver 430 supplies the data signals to the data lines D1 through Dm in response to data control signals DCS from the timing controller 440. The data signals supplied to the data lines D1 through Dm are supplied to the pixels PXL1, PXL2', and PXL3' selected by the scan signals. Here, the data driver 430 is illustrated as being arranged below the first pixel region PA1. However, embodiments are not limited thereto not limited thereto. For example, the data driver 430 may be arranged above the first pixel region PA1.

The timing controller 440 supplies first gate control signals GCS1, second gate control signals GCS2, third gate control signals GCS3, fourth gate control signals GCS4, and the data control signals DCS generated based on timing signals supplied from the outside to the first scan driver 410, the first emission driver 420, the second scan driver 410', the second emission driver 420', and the data driver 430.

According to the present embodiment, a W/L of at least one specific transistor included in each of the first pixels PXL1, the second pixels PXL2', and/or the third pixels PXL3' and performing the same function and/or capacity of at least one specific capacitor included in each of the first pixels PXL1, the second pixels PXL2', and/or the third pixels PXL3' and performing the same function, differ so that brightness differences may be compensated for.

Specifically, the first pixels PXL1 in the first pixel region PA1 with the first width WD1, the second pixels PXL2' in the second pixel region PA2' with the fifth width WD5, and the third pixels PXL3' in the third pixel region PA3' with the sixth width WD6, have different RC loads. For convenience sake, it is assumed that the fifth width WD5 and the sixth width WD6 are equal to each other. In particular, an RC load of the first scan lines S1 in the first pixel region PA1 with the first width WD1 is different from an RC load of the second scan lines S2 (or the third scan lines S3) positioned in the second pixel region PA2' (or the third pixel region PA3') with the fifth width WD5 (or the sixth width WD6). In this case, response to the data signals having the same voltage, voltages stored in the first pixels PXL1 and the second pixels PXL2' (or the third pixels PXL3') differs.

That is, although data signals having the same grayscale are supplied, different voltages are stored in the first pixels PXL1 and the second pixels PXL2' (or the third pixels PXL3') so that a brightness difference is generated between the first pixel region PA1 and the second pixel region PA2' (or the third pixel region PA3'). For example, when the pixels PXL1, PXL2', and PXL3' are formed of PMOS, in response to the data signals having the same grayscale, a darker screen is displayed in the second pixel region PA2' (or the third pixel region PA3') than in the first pixel region PA1.

According to the embodiment, the W/L of the at least one specific transistor included in each the first pixels PXL1 and the second pixels PXL2' and performing the same function and/or the capacity of the at least one specific capacitor included in each the first pixels PXL1 and the second pixels PXL2' and performing the same function are set to vary so that the brightness difference may be compensated for. Here, since the fifth width WD5 and the sixth width WD6 are equal, W/Ls of specific transistors included in the second pixels PXL2' and the third pixels PXL3' and capacities of specific capacitors may be equal.

Figure 9:
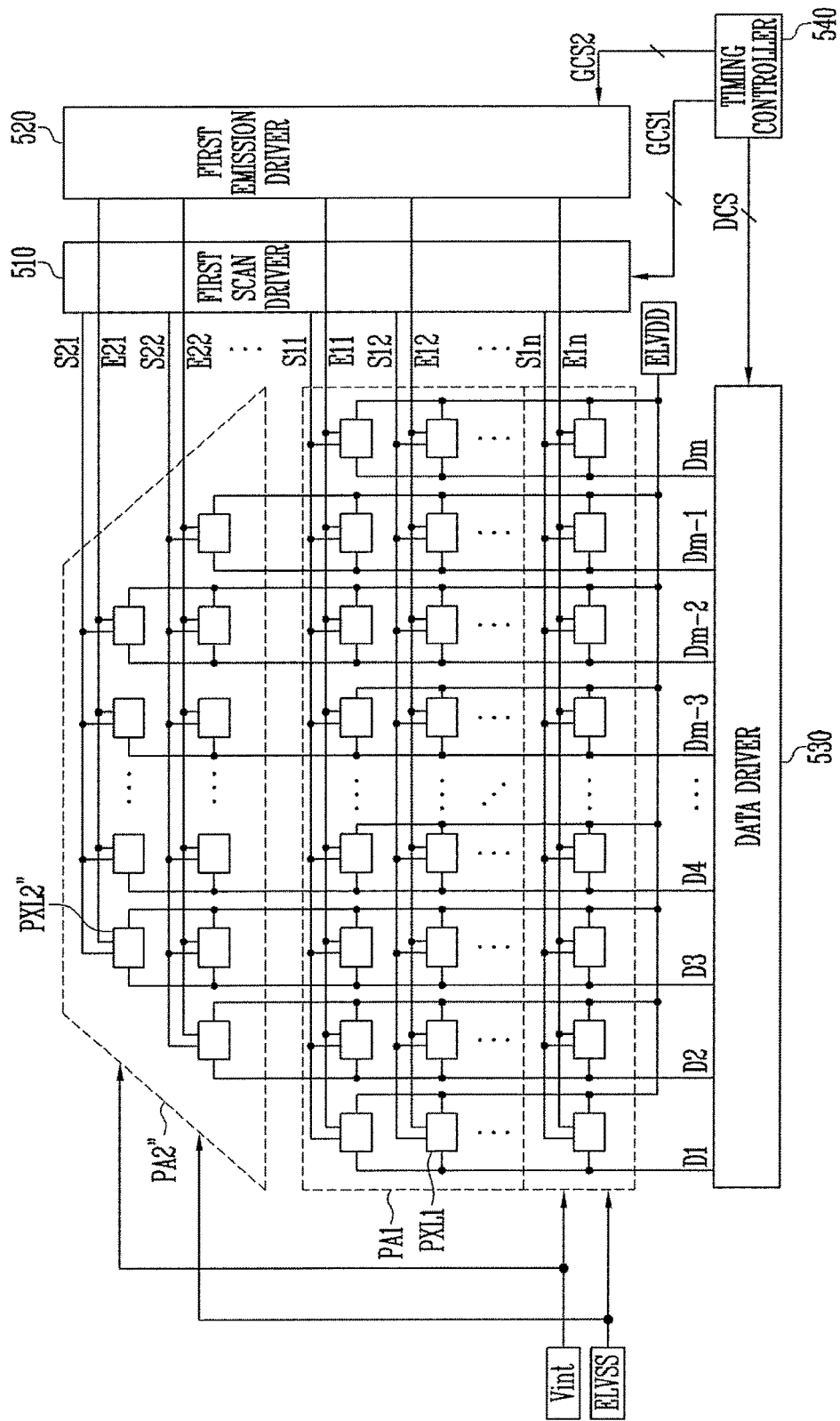
FIG. 9 illustrates a view of an embodiment of an organic light emitting display device corresponding to the substrate of FIG. 4.

FIG. 9 is a view illustrating an embodiment of an organic light emitting display device corresponding to the substrate of FIG. 4. Referring to FIG. 9, the organic light emitting display device according to another embodiment includes a first scan driver 510, a first emission driver 520, a data driver 530, a timing controller 540, and first pixels PXL1 and second pixels PXL2".

The first pixels PXL1 in the first pixel region PA1 are connected to the first scan lines S11 through Sin, the first emission control lines E11 through E1n, and the data lines D1 through Dm. The first pixels PXL1 receive data signals from the data lines D1 through Dm when scan signals are supplied from the first scan lines S11 through Sin. The first pixels PXL1 that receive the data signals control an amount of current that flows from a first power source ELVDD to a second power source ELVSS via OLEDs.

The second pixels PXL2" in the second pixel region PA2" are connected to the second scan lines S21 and S22, second emission control lines E21 and E22, and data lines D2 through Dm-1. The second pixels PXL2" receive the data signals from the data lines D2 through Dm-1 when the scan signals are supplied to the second scan lines S21 and S22. The second pixels PXL2" that receive the data signals control the amount of current that flows from the first power source ELVDD to the second power source ELVSS via the OLEDs.

Here, the width of the second pixel region PA2" is set to be gradually reduced from the first width WD1 to the seventh width WD7. Therefore, the number of second pixels PXL2" formed in each of at least one horizontal line is set to vary. In this case, in the second pixel region PA2", load of the second scan lines S2 is set to vary in units of at least one horizontal line so that a brightness difference may be generated in units of at least one horizontal line.

Figure 10:
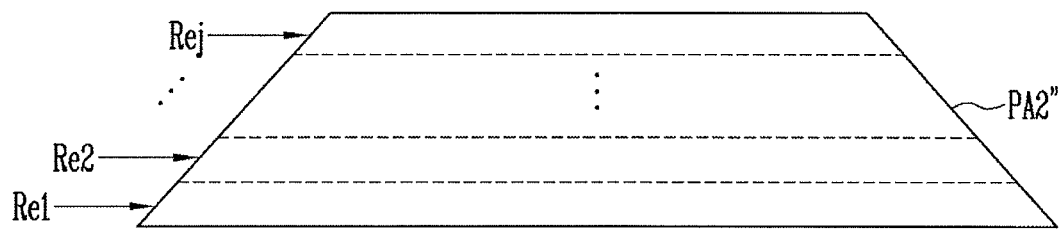
FIG. 10 illustrates a view of an embodiment of the second pixel region of FIG. 9.

According to the present embodiment, in order to prevent the brightness difference in units of horizontal lines, as illustrated in FIG. 10, the second pixel region PA2" may be divided into j (j is a natural number of no less than 2) regions Re1, . . . , and Rej including at least one horizontal line.

The first scan driver 510 supplies scan signals to the second scan lines S2 and the first scan lines S1 in response to the first gate control signal GCS1 from the timing controller 540. For example, the first scan driver 510 may sequentially supply the scan signals to the second scan lines S2 and the first scan lines S1. When the scan signals are sequentially supplied to the second scan lines S2 and the first scan lines S1, the second pixels PXL2" and the first pixels PXL1 are sequentially selected in units of horizontal lines.

In FIG. 9, the second pixel region PA2" and the first pixel region PA1 are driven by the same scan driver 510. However, embodiments are not limited thereto not limited thereto. For example, the second pixel region PA2" and the first pixel region PA1 may be driven by different scan drivers.

The first emission driver 520 supplies emission control signals to the second emission control lines E2 and the first emission control lines E1 in response to the second gate control signal GCS2 from the timing controller 540. For example, the first emission driver 520 may sequentially supply the emission control signals to the second emission control lines E2 and the first emission control lines E1.

In FIG. 9, the second pixel region PA2" and the first pixel region PA1 are driven by the same emission driver 520. However embodiments are not limited thereto not limited thereto. For example, the second pixel region PA2" and the first pixel region PA1 may be driven by different emission drivers.

The data driver 530 supplies the data signals to the data lines D1 through Dm in response to data control signals DCS from the timing controller 540. The data signals supplied to the data lines D1 through Dm are supplied to the pixels PXL1 and PXL2" selected by the scan signals. Here, the data driver 530 is illustrated as being arranged below the first pixel region PA1. However, embodiments are not limited thereto not limited thereto. For example, the data driver 530 may be arranged above the first pixel region PA1.

The timing controller 540 supplies first gate control signals GCS1, second gate control signals GCS2, and the data control signals DCS generated based on timing signals supplied from the outside to the first scan driver 510, the first emission driver 520, and the data driver 530.

According to the present embodiment, a W/L of at least one specific transistor included in each of the first pixels PXL1 and the second pixels PXL2" and performing the same function and/or capacity of at least one specific capacitor included in each of the first pixels PXL1 and the second pixels PXL2" and performing the same function may differ so that a brightness difference may be compensated. In addition, in each of the j regions Re1 through Rej, W/Ls of specific transistors included in the second pixels PXL2" and performing the same function and/or capacities of specific capacitors included in the second pixels PXL2" and performing the same function may differ so that brightness differences among j regions Re1 through Rej may be compensated.

In addition, the second pixel region PA2 illustrated in FIG. 1B may be divided into the j regions Re1 through Rej as illustrated in FIG. 10. In each of the regions Re1 through Rej, the W/Ls of the specific transistors included in the second pixels PXL2 and/or capacities of specific capacitors included in the second pixels PXL2 may differ.

The above-described j regions Re1 through Rej include at least one horizontal line. That is, each of the j regions Re1 through Rej may include one scan line. In addition, each of the j regions Re1 through Rej may include no less than two scan lines. When each of the j regions Re1 through Rej includes no less than two scan lines, each of the j regions Re1 through Rej may include the pixels PXL2 and PXL2" positioned in no less than two horizontal lines. That is, according to the embodiment, when a brightness difference is not recognizable although widths of horizontal lines vary, adjacent horizontal lines may be included in the same region (one of Re1 through Rej).

Figure 11A:
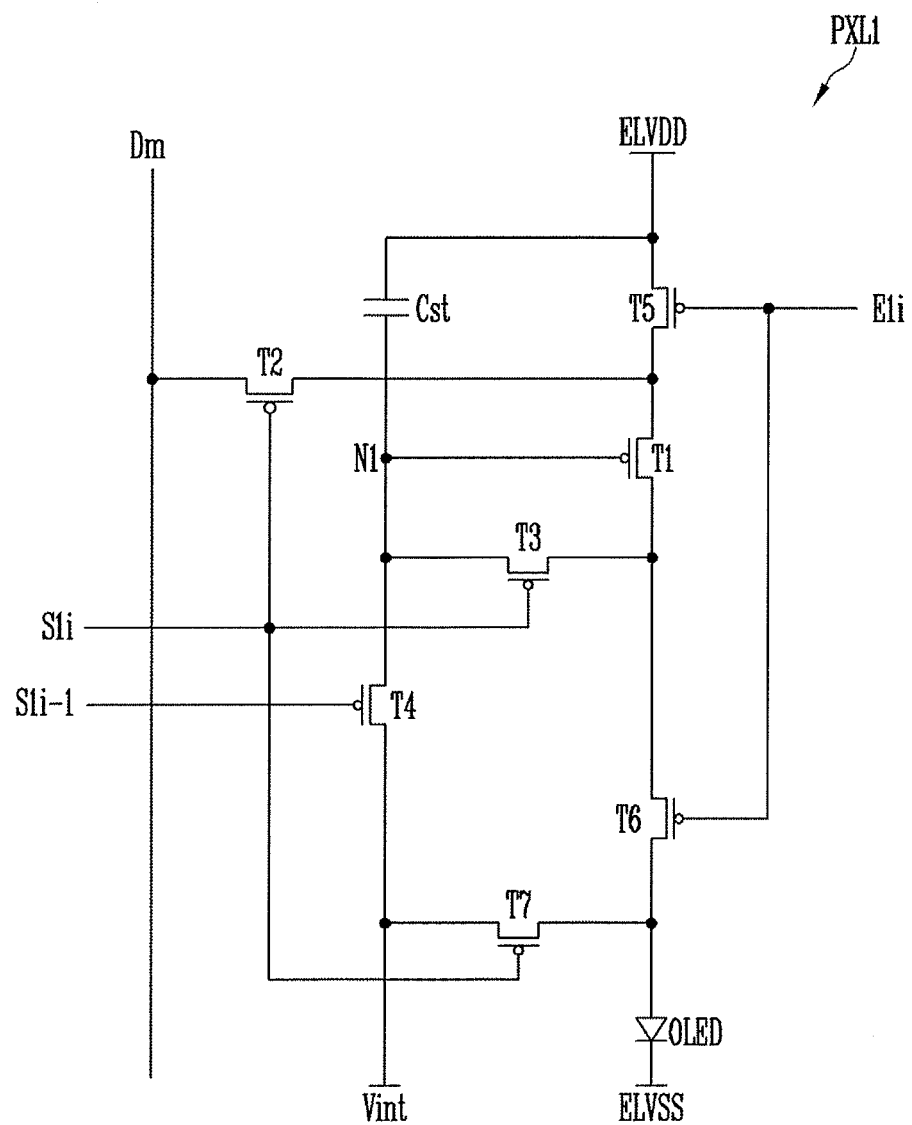
FIG. 11A illustrates an embodiment of the first pixel of FIGS. 5, 7, 8, and 9.
Figure 11B:
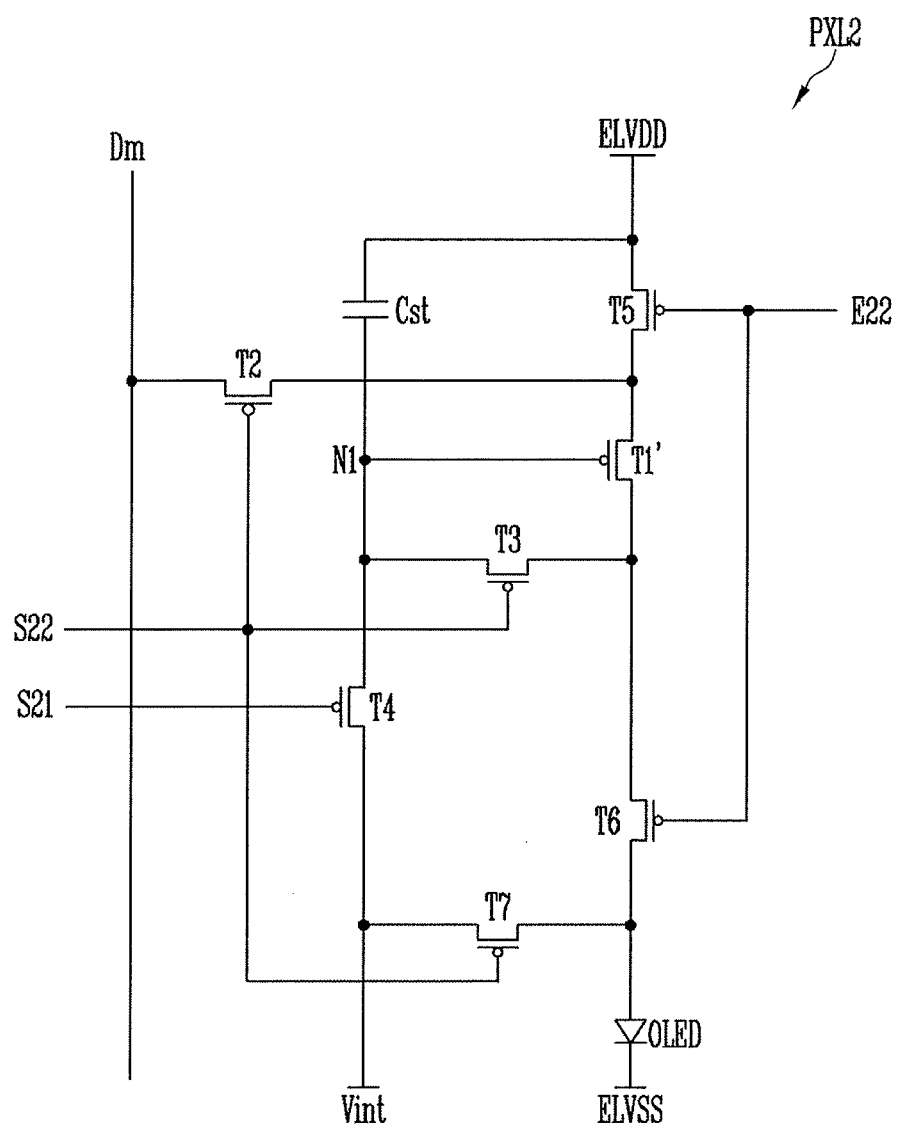
FIG. 11B illustrates an embodiment of the second pixel of FIGS. 5 and 7.
Figure 11C:
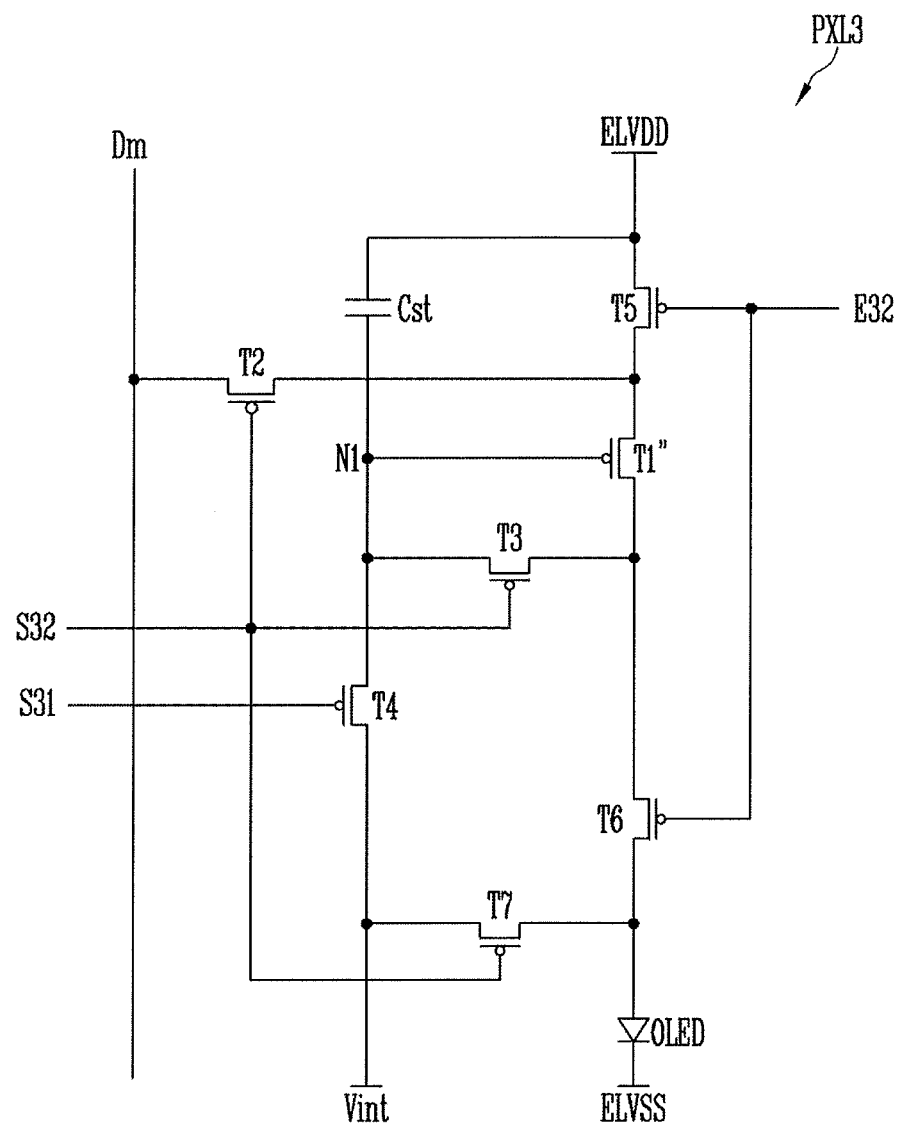
FIG. 11C illustrates an embodiment of the third pixel of FIG. 7.

FIG. 11A illustrates an embodiment of the first pixel of FIGS. 5, 7, 8, and 9. FIG. 11B illustrates an embodiment of the second pixel of FIGS. 5 and 7. FIG. 11C illustrates an embodiment of the third pixel of FIG. 7. Here, the first pixel PXL1, the second pixel PXL2, and the third pixel PXL3 have the same circuit configuration other than W/Ls of first transistors T1, T1', and T1" that are specific transistors, e.g., driving transistors.

The second pixels PXL2' and the third pixels PXL3' illustrated in FIG. 8 and the second pixels PXL2" illustrated in FIG. 9 are set to have the same circuit configurations as illustrated in FIGS. 11A and 11C other than W/Ls of driving transistors.

The W/Ls described hereinafter are determined to correspond to a width of each pixel region and are not limited to specific numbers. For convenience sake, a circuit configuration will be described by using the first pixel PXL1 connected to the mth data line Dm and an ith (i is a natural number) first scan line S1$i$.

Referring to FIG. 11A, the first pixel PXL1 according to the embodiment includes an OLED OLED, first through seventh transistors T1 through T7, and a storage capacitor Cst.

An anode electrode of the OLED OLED is connected to a second electrode of the first transistor T1 via the sixth transistor T6 and a cathode electrode is connected to a second power source ELVSS. The OLED OLED generates light with predetermined brightness to correspond to an amount of current supplied from the first transistor T1. Here, a first power source ELVDD may have a higher voltage than the second power source ELVSS so that a current may flow to the OLED OLED.

The seventh transistor T7 is connected between an initializing power source Vint and the anode electrode of the OLED OLED. A gate electrode of the seventh transistor T7 is connected to the ith first scan line S1$i$. The seventh transistor T7 is turned on when a scan signal is supplied to the ith first scan line S1$i$ and supplies a voltage of the initializing power source Vint to the anode electrode of the OLED OLED. Here, the initializing power source Vint is set to have a lower voltage than a data signal.

The sixth transistor T6 is connected between the second electrode of the first transistor T1 and the anode electrode of the OLED OLED. A gate electrode of the sixth transistor T6 is connected to an ith first emission control line E1$i$. The sixth transistor T6 is turned off when an emission control signal is supplied to an ith first emission control line E1$i$ and is turned on in the other case.

The fifth transistor T5 is connected between the first power source ELVDD and a first electrode of the first transistor T1. A gate electrode of the fifth transistor T5 is connected to the ith first emission control line E1$i$. The fifth transistor T5 is turned off when the emission control signal is supplied to the ith first emission control line E1i and is turned on in the other case.

The first electrode of the first transistor T1 (a driving transistor) is connected to the first power source ELVDD via the fifth transistor T5 and the second electrode thereof is connected to the anode electrode of the OLED OLED via the sixth transistor T6. A gate electrode of the first transistor T1 is connected to a first node N1. The first transistor T1 controls an amount of current that flows from the first power source ELVDD to the second power source ELVSS via the OLED OLED to correspond to a voltage of the first node N1.

The third transistor T3 (a control transistor) is connected between the second electrode of the first transistor T1 and the first node N1. A gate electrode of the third transistor T3 is connected to the ith first scan line S1i. The third transistor T3 is turned on when the scan signal is supplied to the ith first scan line S1i and electrically connects the second electrode of the first transistor T1 and the first node N1. Therefore, when the third transistor T3 is turned on, the first transistor T1 is diode-connected.

The fourth transistor T4 is connected between the first node N1 and the initializing power source Vint. A gate electrode of the fourth transistor t4 is connected to an (i−1)th first scan line S1i-1. The fourth transistor T4 is turned on when a scan signal is supplied to the (i−1)th scan line S1i-1 and supplies the voltage of the initializing power source Vint to the first node N1.

The second transistor T2 is connected between the mth data line Dm and the first electrode of the first transistor T1. A gate electrode of the second transistor T2 is connected to the ith first scan line S1i. The second transistor T2 is turned on when the scan signal is supplied to the ith first scan line S1i and electrically connects the mth data ilne Dm and the first electrode of the first transistor t1.

The storage capacitor Cst is connected between the first power source ELVDD and the first node N1. The storage capacitor Cst stores the data signal and a voltage corresponding to a threshold voltage of the first transistor T1.

On the other hand, the second pixel PXL2 and the third pixel PXL3 are set to have the same circuit configuration as that of the first pixel PXL1 other than the W/Ls of the first transistors T1, T1', and T1". Therefore, detailed description of the second pixel PXL2 and the third pixel PXL3 will not be given.

Figure 12:
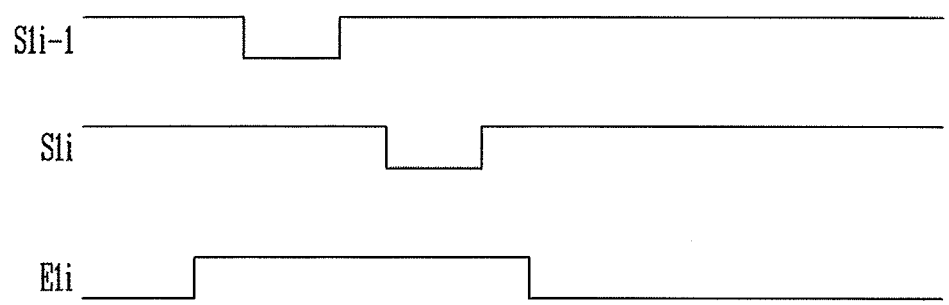
FIG. 12 illustrates a waveform diagram of an embodiment of a method of driving the first pixel of FIG. 11A.

FIG. 12 is a waveform diagram illustrating an embodiment of a method of driving the first pixel of FIG. 11A.

Referring to FIG. 12, first, the emission control signal is supplied to the ith first emission control line E1i. When the emission control signal is supplied to the ith first emission control line E1i, the fifth transistor T5 and the sixth transistor T6 are turned off.

When the fifth transistor T5 is turned off, the first power source ELVDD and the first electrode of the first transistor T1 are electrically isolated. When the sixth transistor T6 is turned off, the second electrode of the first transistor T1 and the anode electrode of the OLED OLED are electrically isolated. Therefore, in a period in which the emission control signal is supplied to the ith first emission control line E1i, the first pixel PXL1 is set to be in a non-emission state.

After the emission control signal is supplied to the ith first emission control line E1i, a scan signal is supplied to the (i−1)th first scan line S1i-1. When the scan signal is supplied to the (i−1)th first scan line S1i-1, the fourth transistor T4 is turned on. When the fourth transistor T4 is turned on, the voltage of the initializing power source Vint is supplied to the first node N1.

After the scan signal is supplied to the (i−1)th first scan line S1i-1, the scan signal is supplied to the ith first scan line S1i. When the scan signal is supplied to the ith first scan line S1i, the second transistor T2, the third transistor T3, and the seventh transistor T7 are turned on.

When the third transistor T3 is turned on, the second electrode of the first transistor T1 and the first node N1 are electrically connected. That is, when the third transistor T3 is turned on, the first transistor T1 is diode-connected.

When the second transistor T2 is turned on, the data signal from the data line Dm is supplied to the first electrode of the first transistor T1. At this time, since the first node N1 is set to have the voltage of the initializing power source Vint that is lower than that of the data signal, the first transistor T1 is turned on. When the first transistor T1 is turned on, a voltage obtained by subtracting an absolute value of the threshold voltage of the first transistor T1 from the voltage of the data signal is supplied to the first node N1. At this time, the storage capacitor Cst stores a voltage corresponding to the voltage of the first node N1.

When the seventh transistor T7 is turned on, the voltage of the initializing voltage Vint is supplied to the anode electrode of the OLED OLED. Then, a parasitic capacitor (not shown) of the OLED OLED is initialized to the voltage of the initializing power source Vint.

After the data signal and a voltage corresponding to the threshold voltage of the first transistor T1 are charged in the storage capacitor Cst, supply of the emission control signal to the ith first emission control line E1i is stopped.

When the supply of the emission control signal to the ith first emission control line E1i is stopped, the fifth transistor T5 and the sixth transistor T6 are turned on. When the fifth transistor T5 is turned on, the first power source ELVDD and the first electrode of the first transistor T1 are electrically connected. When the sixth transistor T6 is turned on, the second electrode of the first transistor T1 and the anode electrode of the OLED OLED are electrically connected. At this time, the first transistor T1 controls the amount of current that flows from the first power source ELVDD to the second power source ELVSS via the OLED OLED to correspond to the voltage of the first node N. Then, the OLED OLED generates light with predetermined brightness to correspond to the amount of current supplied from the first transistor T1.

In FIG. 12, operation processes are described by using the first pixel PXL1. Here, since the second pixel PXL2 and the third pixel PXL3 having the same circuit configuration as the first pixel PXL1 are driven by the same method as the first pixel PXL1, detailed description thereof will not be given.

According to the embodiment, W/Ls of the first transistor T1 included in the first pixel PXL1, the first transistor T1' included in the second pixel PXL2, and the first transistor T1" included in the third pixel PXL3 differ so that a brightness difference between the first pixel region PA1 and the second pixel region PA2 and a brightness difference between the second pixel region PA2 and the third pixel region PA3 may be compensated.

For example, the W/L of the first transistor T1 included in the first pixel PXL1 is set to be smaller than the W/L of the first transistor T1' included in the second pixel PXL2 so that a brightness difference between the first pixel region PA1 and the second pixel region PA2 may be compensated for. The W/L of the first transistor T1' included in the second pixel PXL2 is set to be smaller than the W/L of the first transistor T1" included in the third pixel PXL3 so that a brightness difference between the second pixel region PA2 and the third pixel region PA3 may be compensated for.

Specifically, currents that flow through the first transistors T1, T1', and T1" are set to be proportional to the W/Ls, e.g., ids=(½)×(W/L)×μCox(Vgs−Vth)². Here, Vgs represents voltages applied to the gate electrodes and the source electrodes of the first transistors T1, T1', and T1", Vth represents threshold voltages of the first transistors T1, T1', and T1", μ represents mobility, and Cox represents gate capacities by unit area of the first transistors T1, T1', and T1".

In the organic light emitting display device of FIG. 5, when the W/Ls of the first transistors T1 and T1' in the first pixel PXL1 and the second pixel PXL2 are equal, a first voltage is stored in the first pixels PXL1 and a second voltage higher than the first voltage is stored in the second pixels PXL2 when data signals having the same voltage are supplied to correspond to RC loads of scan lines S1 and S2. In this case, to correspond to the data signals having the same voltage, the first pixel region PA1 displays a brighter image than the second pixel region PA2.

In order to compensate for the brightness difference between the first pixel region PA1 and the second pixel region PA2, according to the embodiment, the W/L of the first transistor T1' included in the second pixel PXL2 is set to be larger than the W/L of the first transistor T1 included in the first pixel PXL1. Then, in an emission period, to correspond to the data signals having the same voltage, the second pixel PXL2 supplies more current to the OLED OLED than the first pixel PXL1 so that brightness of the second pixel region PA2 increases. When the brightness of the second pixel region PA2 increases, the brightness difference between the first pixel region PA1 and the second pixel region PA2 may be minimized.

For this purpose, the W/L of the first transistor T1 included in the first pixel PXL1 and the W/L of the first transistor T1' included in the second pixel PXL2 may be experimentally determined so that the brightness difference is minimized.

In addition, in the organic light emitting display device of FIG. 7, when the W/Ls of the first transistors T1, T1', and T1" in the first pixel PXL1, the second pixel PXL2, and the third pixel PXL3 are equal, a first voltage is stored in the first pixels PXL1, a second voltage higher than the first voltage is stored in the second pixels PXL2, and a third voltage higher than the second voltage is stored in the third pixels PXL3 when data signals having the same voltage are supplied to correspond to RC loads of scan lines S1, S2, and S3.

According to the embodiment, when the W/L of the first transistor T1 in the first pixel PXL1 is set to be smaller than the W/L of the first transistor T1' in the second pixel PXL2 and the W/L of the first transistor T1' included in the second pixel PXL2 is set to be smaller than the W/L of the first transistor T1" in the third pixel PXL3, a brightness difference between the first pixel region PA1 and the second pixel region PA2 and a brightness difference between the second pixel region PA2 and the third pixel region PA3 may be compensated.

That is, in the emission period, to correspond to the data signals having the same voltage, the second pixel PXL2 supplies more current to the OLED OLED than the first pixel PXL1 so that brightness of the second pixel region PA2 increases. In the emission period, to correspond to the data signals having the same voltage, the third pixel PXL3 supplies more current to the OLED OLED than the second pixel PXL2 so that brightness of the third pixel region PA3 increases. The W/L of the first transistor T1 in the first pixel PXL1, the W/L of the first transistor T1' in the second pixel PXL2, and the W/L of the first transistor T1" in the third pixel PXL3 may be experimentally determined so that the brightness differences are minimized.

As described above, according to the embodiment, W/L of a driving transistor of a pixel positioned in a region with a large width is set to be smaller than W/L of a driving transistor of a pixel positioned in a region with a small width. Then, a brightness difference corresponding to a width of a pixel region may be compensated for.

The W/Ls of the first transistors respectively included in the second pixels PXL2' and the third pixels PXL3' of the organic light emitting display device illustrated in FIG. 8 are set to be larger than the W/Ls of the first transistors respectively included in the first pixels PXL1. Then, a brightness difference between the first pixel region PA1 and the second pixel region PA2' and a brightness difference between the second pixel region PA2' and the third pixel region PA3' may be compensated.

In addition, the W/Ls of the first transistors respectively included in the second pixels PXL2" of the organic light emitting display device illustrated in FIG. 9 are set to be larger than the W/Ls of the first transistors respectively included in the first pixels PXL1. Then, a brightness difference between the first pixel region PA1 and the second pixel region PA2" may be compensated for.

In addition, W/Ls of the first transistors respectively included in the second pixels PXL2" of the organic light emitting display device illustrated in FIG. 9 may set to vary by region of FIG. 10. For example, the W/Ls of the first transistors respectively included in the second pixels PXL2" in the first region Re1 with a large width may be smaller than the W/Ls of the first transistors respectively included in the second pixels PXL2" in the jth region Rej with a small width.

On the other hand, in the above description, the W/L includes a case in which a channel width W changes and/or a case in which a channel length L changes. For example is, a channel width W of a driving transistor in a pixel region with a large width and a channel width W of a driving transistor in a pixel region with a small width are equal, while a channel length L of the driving transistor in the pixel region with the large width and a channel length L of the driving transistor in the pixel region with the small width differ. Alternatively, the channel length L of the driving transistor in the pixel region with the large width and the channel length L of the driving transistor in the pixel region with the small width are equal, while the channel width W of the driving transistor in the pixel region with the large width and the channel width W of the driving transistor in the pixel region with the small width differ.

Figure 13A:
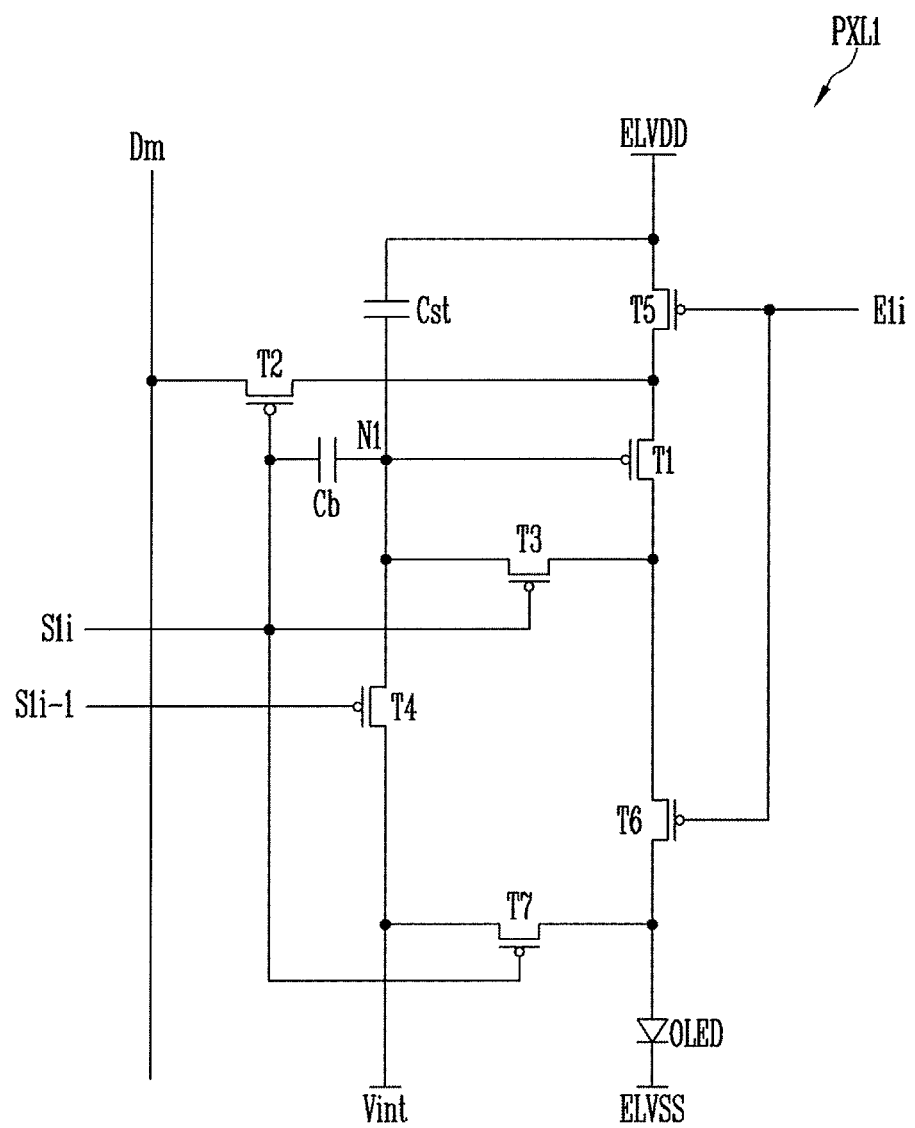
FIG. 13A illustrates another embodiment of the first pixel of FIGS. 5, 7, 8, and 9.
Figure 13B:
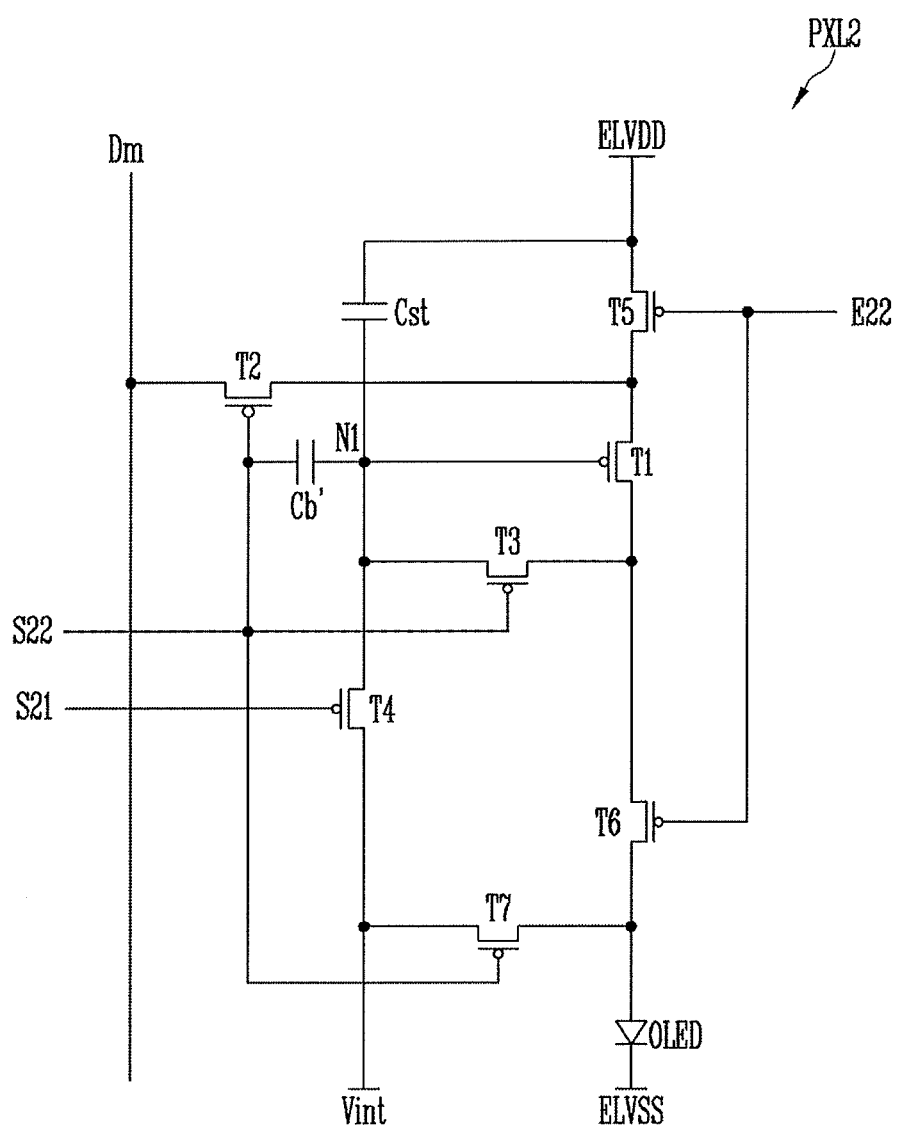
FIG. 13B illustrates another embodiment of the second pixel of FIGS. 5 and 7.
Figure 13C:
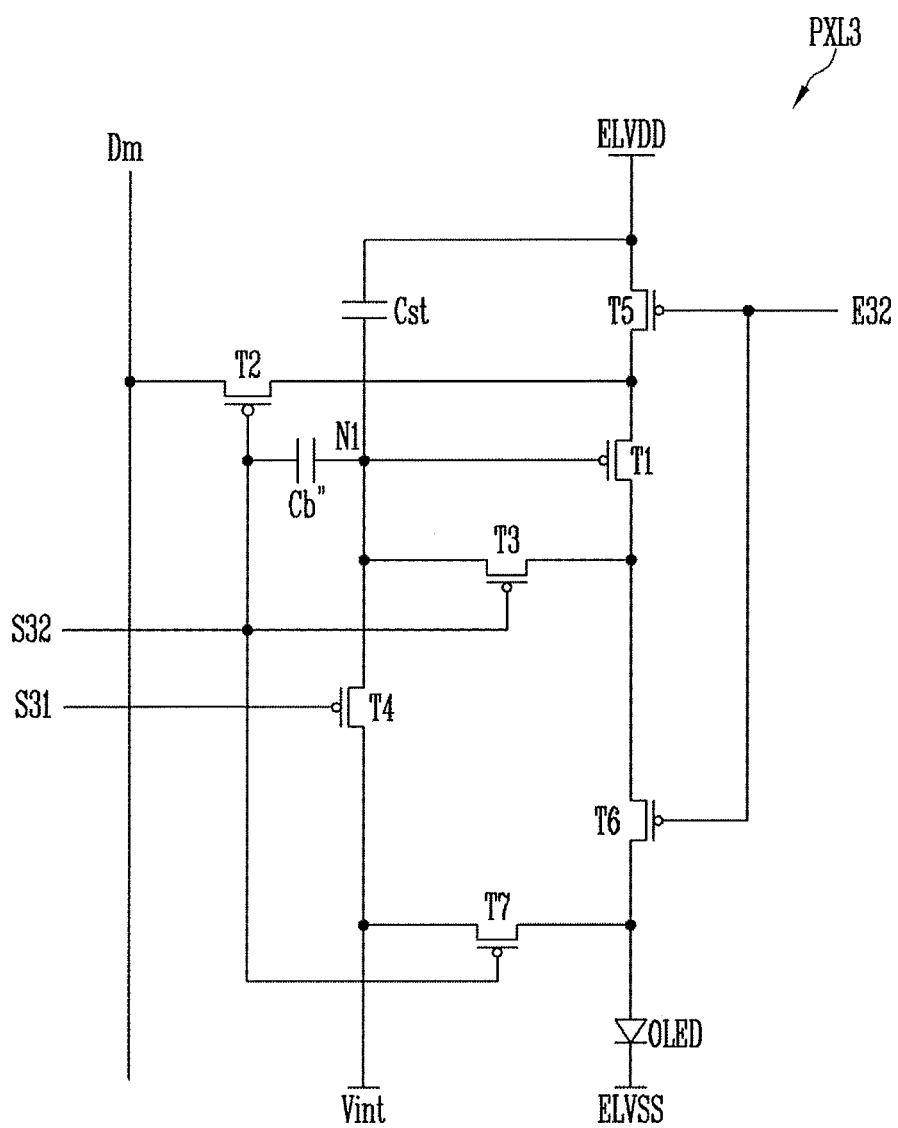
FIG. 13C illustrates another embodiment of the third pixel of FIG. 7.

FIG. 13A illustrates another embodiment of the first pixel of FIGS. 5, 7, 8, and 9. FIG. 13B illustrates another embodiment of the second pixel of FIGS. 5 and 7. FIG. 13C illustrates another embodiment of the third pixel of FIG. 7. Here, the first pixel PXL1, the second pixel PXL2, and the third pixel PXL3 have the same circuit configuration other than capacities of specific capacitors, that is, boosting capacitors Cb, Cb', and Cb".

The second pixel PXL2' and the third pixel PXL3' illustrated in FIG. 8 and the second pixel PXL2" illustrated in FIG. 9 are set to have the same circuit configuration as illustrated in FIGS. 13A through 13C other than capacities of boosting capacitors.

The capacities of the boosting capacitors described hereinafter are relatively determined to correspond to widths of the respective pixel regions and are not limited to specific numbers. In describing FIGS. 13A through 13C, the same elements as illustrated in FIGS. 11A through 11C are denoted by the same reference numerals.

Referring to FIG. 13A, the first pixel PXL1 according to the embodiment includes an OLED OLED, first through seventh transistors T1 through T7, a storage capacitor Cst, and a boosting capacitor Cb.

The boosting capacitor Cb is connected between an ith first scan line S1$i$ and a first node N1. The boosting capacitor Cb controls a voltage of the first node N1 in response to a scan signal supplied to the ith first scan line S1$i$.

The boosting capacitor Cb compensates for voltage loss of a data signal. A voltage of the data signal that is lower than a desired voltage is supplied to the first node N1 due to voltage drop. When supply of the scan signal to the ith first scan line S1$i$ is stopped, the boosting capacitor Cb increases the voltage of the first node N1 so that the voltage drop of the data signal may be compensated for.

An anode electrode of the OLED OLED is connected to a second electrode of the first transistor T1 via the sixth transistor T6 and a cathode electrode thereof is connected to the second power source ELVSS. The OLED OLED generates light with predetermined brightness to correspond to an amount of current supplied from the first transistor T1. Here, the first power source ELVDD may have a higher voltage than the second power source ELVSS so that a current may flow to the OLED OLED.

The seventh transistor T7 is connected between the initializing power source Vint and the anode electrode of the OLED OLED. A gate electrode of the seventh transistor T7 is connected to the ith first scan line S1$i$. The seventh transistor T7 is turned on when the scan signal is supplied to the ith first scan line S1$i$ and supplies the voltage of the initializing power source Vint to the anode electrode of the OLED OLED. Here, the initializing power source Vint is set to have a lower voltage than the data signal.

The sixth transistor T6 is connected between the second electrode of the first transistor T1 and the anode electrode of the OLED OLED. A gate electrode of the sixth transistor T6 is connected to the ith first emission control line E1$i$. The sixth transistor T6 is turned off when the emission control signal is supplied to the ith first emission control line E1$i$ and is turned on in the other case.

The fifth transistor T5 is connected between the first power source ELVDD and a first electrode of the first transistor T1. A gate electrode of the fifth transistor T5 is connected to the ith first emission control line E1$i$. The fifth transistor T5 is turned off when the emission control signal is supplied to the ith first emission control line E1$i$ and is turned on in the other case.

The first electrode of the first transistor T1 is connected to the first power source ELVDD via the fifth transistor T5 and the second electrode thereof is connected to the anode electrode of the OLED OLED via the sixth transistor T6. A gate electrode of the first transistor T1 is connected to a first node N1. The first transistor T1 controls an amount of current that flows from the first power source ELVDD to the second power source ELVSS via the OLED OLED to correspond to a voltage of the first node N1.

The third transistor T3 is connected between the second electrode of the first transistor T1 and the first node N1. A gate electrode of the third transistor T3 is connected to the ith first scan line S1$i$. The third transistor T3 is turned on when the scan signal is supplied to the ith first scan line S1$i$ and electrically connects the second electrode of the first transistor T1 and the first node N1. Therefore, when the third transistor T3 is turned on, the first transistor T1 is diode-connected.

The fourth transistor T4 is connected between the first node N1 and the initializing power source Vint. A gate electrode of the fourth transistor T4 is connected to an (i−1)th first scan line S1$i$-1. The fourth transistor T4 is turned on when a scan signal is supplied to the (i−1)th scan line S1$i$-1 and supplies the voltage of the initializing power source Vint to the first node N1.

The second transistor T2 is connected between the mth data line Dm and the first electrode of the first transistor T1. A gate electrode of the second transistor T2 is connected to the ith first scan line S1$i$. The second transistor T2 is turned on when the scan signal is supplied to the ith first scan line S1$i$ and electrically connects the mth data ilne Dm and the first electrode of the first transistor T1.

The storage capacitor Cst is connected between the first power source ELVDD and the first node N1. The storage capacitor Cst stores the data signal and a voltage corresponding to a threshold voltage of the first transistor T1.

On the other hand, the second pixel PXL2 and the third pixel PXL3 are set to have the same circuit configuration as that of the first pixel PXL1 other than capacities of the boosting capacitors Cb, Cb', and Cb". Therefore, detailed description of the second pixel PXL2 and the third pixel PXL3 will not be given.

Operation processes will be described as follows with reference to FIGS. 13A and 12. First, the emission control signal is supplied to the ith first emission control line E1$i$. When the emission control signal is supplied to the ith first emission control line E1$i$, the fifth transistor T5 and the sixth transistor T6 are turned off.

When the fifth transistor T5 is turned off, the first power source ELVDD and the first electrode of the first transistor T1 are electrically isolated. When the sixth transistor T6 is turned off, the second electrode of the first transistor T1 and the anode electrode of the OLED OLED are electrically isolated. Therefore, in a period in which the emission control signal is supplied to the ith first emission control line E1$i$, the first pixel PXL1 is set to be in a non-emission state.

After the emission control signal is supplied to the ith first emission control line E1$i$, a scan signal is supplied to the (i−1)th first scan line S1$i$-1. When the scan signal is supplied to the (i−1)th first scan line S1$i$-1, the fourth transistor T4 is turned on. When the fourth transistor T4 is turned on, the voltage of the initializing power source Vint is supplied to the first node N1.

After the scan signal is supplied to the (i−1)th first scan line S1$i$-1, the scan signal is supplied to the ith first scan line S1$i$. When the scan signal is supplied to the ith first scan line S1$i$, the second transistor T2, the third transistor T3, and the seventh transistor T7 are turned on.

When the third transistor T3 is turned on, the second electrode of the first transistor T1 and the first node N1 are electrically connected. That is, when the third transistor T3 is turned on, the first transistor T1 is diode-connected.

When the second transistor T2 is turned on, the data signal from the data line Dm is supplied to the first electrode of the first transistor T1. At this time, since the first node N1 is set to have the voltage of the initializing power source Vint that is lower than that of the data signal, the first transistor T1 is turned on. When the first transistor T1 is turned on, a voltage obtained by subtracting an absolute value of the threshold voltage of the first transistor T1 from the voltage of the data signal is supplied to the first node N1. At this time, the storage capacitor Cst stores a voltage corresponding to the voltage of the first node N1.

On the other hand, when the seventh transistor T7 is turned on, the voltage of the initializing voltage Vint is supplied to the anode electrode of the OLED OLED. Then, a parasitic capacitor (not shown) of the OLED OLED is initialized to the voltage of the initializing power source Vint.

After the data signal and a voltage corresponding to the threshold voltage of the first transistor T1 are charged in the storage capacitor Cst, supply of the scan signal to the ith first scan line S1i is stopped. When the supply of the scan signal to the ith first scan line S1i is stopped, a voltage of the ith first scan line S1i is transited from a low voltage to a high voltage. At this time, the voltage of the first node N1 is increased by the boosting capacitor Cb so that the voltage drop of the data signal may be compensated for.

When the supply of the emission control signal to the ith first emission control line E1i is stopped, the fifth transistor T5 and the sixth transistor T6 are turned on. When the fifth transistor T5 is turned on, the first power source ELVDD and the first electrode of the first transistor T1 are electrically connected. When the sixth transistor T6 is turned on, the second electrode of the first transistor T1 and the anode electrode of the OLED OLED are electrically connected. At this time, the first transistor T1 controls the amount of current that flows from the first power source ELVDD to the second power source ELVSS via the OLED OLED to correspond to the voltage of the first node N1. Then, the OLED OLED generates light with predetermined brightness to correspond to the amount of current supplied from the first transistor T1.

According to the embodiment, the boosting capacitor Cb in the first pixel PXL1, the boosting capacitor Cb' in the second pixel PXL2, and the boosting capacitor Cb" in the third pixel PXL3 are set to have different capacities so that the brightness difference between the first pixel region PA1 and the second pixel region PA2, and the brightness difference between the second pixel region PA2 and the third pixel region PA3 may be compensated.

For example, so that the brightness difference between the first pixel region PA1 and the second pixel region PA2 may be compensated, the boosting capacitor Cb included in the first pixel PXL1 may have a higher capacity than the boosting capacitor Cb' included in the second pixel PXL2. So that the brightness difference between the second pixel region PA2 and the third pixel region PA3 may be compensated, the boosting capacitor Cb' included in the second pixel PXL2 may have a higher capacity than the boosting capacitor Cb" included in the third pixel PXL3.

Specifically, capacities of capacitors are set as s A/d. Here, s represents dielectric constants, A represents areas of electrodes, and d represents a distance between the electrodes. That is, the capacities of the capacitors increase as the areas A of the electrodes increase and/or the distance d between the electrodes is reduced. When the areas A of the electrodes increase and/or the distance d between the electrodes is reduced, voltages boosted in the capacitors increase. That is, when the capacities of the capacitors increase, the voltages boosted in the capacitors increase.

Since the voltages boosted in the boosting capacitors Cb, Cb', and Cb" increase in proportion to the capacities of the capacitors, the boosting capacitor Cb included in the first pixel PXL1 transits a voltage of the first node N1 to a higher voltage than the boosting capacitor Cb' included in the second pixel PXL2.

The boosting capacitor Cb' included in the second pixel PXL2 transits a voltage of the first node N1 to a higher voltage than the boosting capacitor Cb" included in the third pixel PXL3.

Specifically, in the organic light emitting display device of FIG. 5, in the case in which the capacities of the boosting capacitors Cb and Cb' included in the first pixel PXL1 and the second pixel PXL2 are the same, when the data signals having the same voltage are supplied to correspond to the RC loads of the scan lines S1 and S2, the first voltage is stored in the first pixels PXL1 and the second voltage higher than the first voltage is stored in the second pixels PXL2.

According to the embodiment, when the boosting capacitor Cb included in the first pixel PXL1 has higher capacity than the boosting capacitor Cb' included in the second pixel PXL2, the voltage boosted in the first pixel PXL1 is higher than the voltage boosted in the second pixel PXL2. Therefore, to correspond to data signals having the same grayscale, the first pixel PXL1 and the second pixel PXL2 may store similar voltages or the same voltage. For this purpose, the capacities of the boosting capacitors Cb and Cb' may be experimentally determined so that the similar voltages or the same voltage may be stored in the first pixel PXL1 and the second pixel PXL2 to correspond to the data signals having the same voltage.

In addition, in the organic light emitting display device of FIG. 7, when the capacities of the boosting capacitors Cb, Cb', and Cb" in the first pixel PXL1, the second pixel PXL2, and the third pixel PXL3 are the same, when the data signals having the same voltage are supplied to correspond to the RC loads of the scan lines S1, S2, and S3, the first voltage is stored in the first pixels PXL1, the second voltage higher than the first voltage is stored in the second pixels PXL2, and the third voltage higher than the second voltage is stored in the third pixels PXL3.

In order to compensate for voltage differences, according to the embodiment, the boosting capacitor Cb included in the first pixel PXL1 may have higher capacity than the boosting capacitor Cb' included in the second pixel PXL2 and the boosting capacitor Cb' included in the second pixel PXL2 may have higher capacity than the boosting capacitor Cb" included in the third pixel PXL3. Then, since the voltage boosted in the first pixel PXL1 is higher than the voltage boosted in the second pixel PXL2 and the voltage boosted in the second pixel PXL2 is higher than the voltage boosted in the third pixel PXL3, the first pixel PXL1, the second pixel PXL2, and the third pixel PXL3 may store similar voltages or the same voltage to correspond to the data signals having the same voltage. For this purpose, the capacities of the boosting capacitors Cb, Cb', and C" may be experimentally determined so that the similar voltages or the same voltage may be stored in the first pixel PXL1, the second pixel PXL2, and the third pixel PXL3 to correspond to the data signals having the same voltage.

As described above, according to the embodiment, boosting capacitors of pixels positioned in regions with large widths may have higher capacities than boosting capacitors of pixels positioned in regions with small widths. Then, brightness differences corresponding to widths of pixel regions may be compensated for.

The boosting capacitors respectively included in the second pixels PXL2' and the third pixels PXL3' of the organic light emitting display device of FIG. 8 may have lower capacities than the boosting capacitors respectively included in the first pixels PXL1. Then, the brightness difference between the first pixel region PA1 and the second pixel region PA2' and the brightness difference between the second pixel region PA2' and the third pixel region PA3' may be compensated.

In addition, the boosting capacitors respectively included in the second pixels PXL2" of the organic light emitting display device illustrated in FIG. 9 are set to have lower capacities than the boosting capacitors respectively included in the first pixels PXL1. Then, the brightness difference between the first pixel region PA1 and the second pixel region PA2" may be compensated for.

In addition, the capacities of the boosting capacitors respectively included in the second pixels PXL2" may vary by region of FIG. 10. For example, the boosting capacitors respectively included in the second pixels PXL2" positioned in the first region Re1 with a large width may have higher capacities than the boosting capacitors respectively included in the second pixels PXL2" positioned in the jth region Rej with a small width.

Figure 14A:
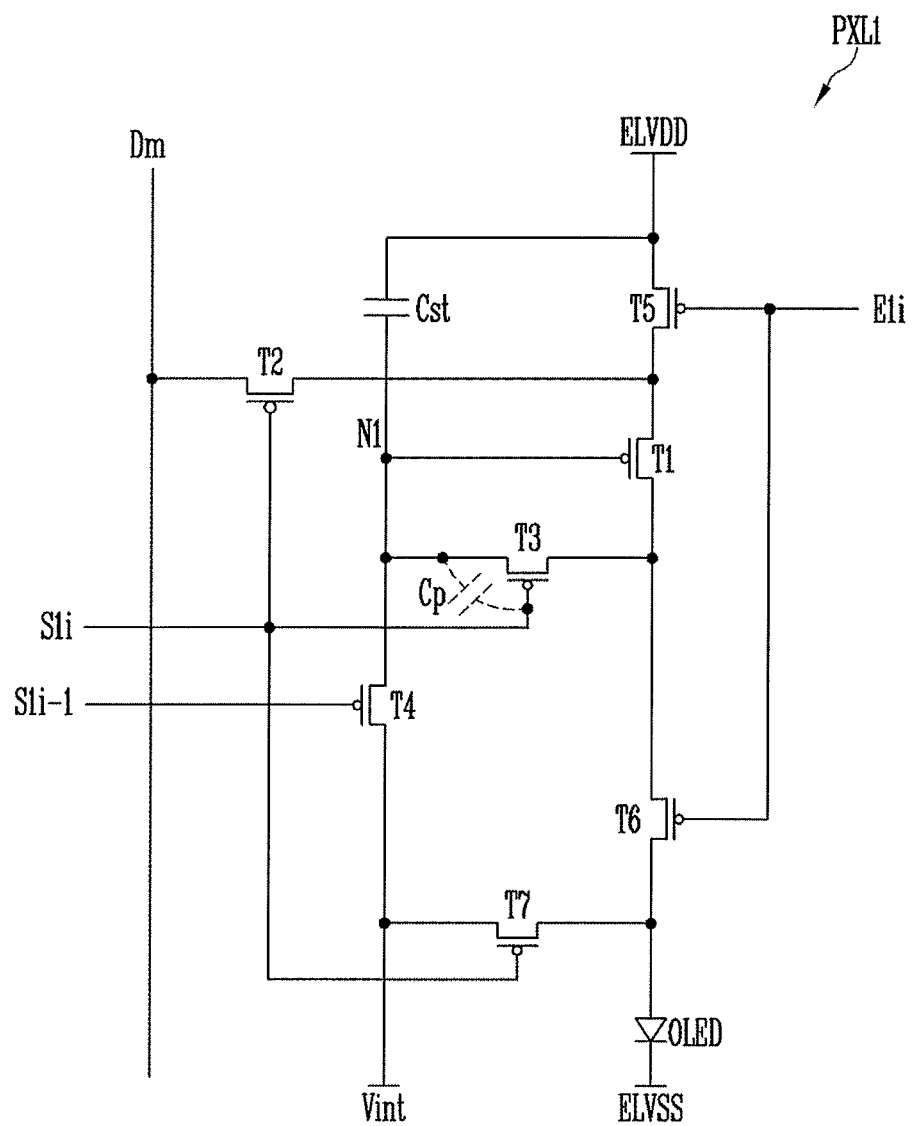
FIG. 14A illustrates another embodiment of the first pixel of FIGS. 5, 7, 8, and 9.
Figure 14B:
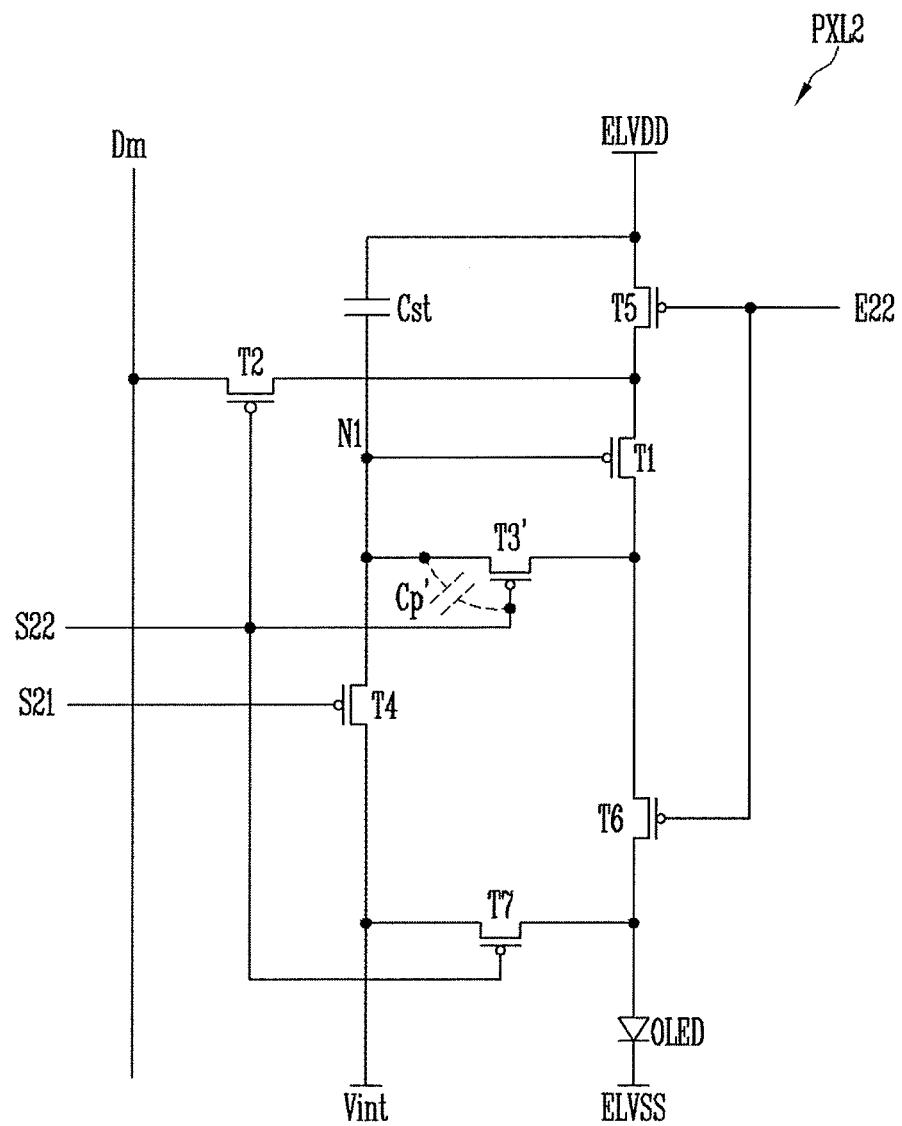
FIG. 14B illustrates another embodiment of the second pixel of FIGS. 5 and 7.
Figure 14C:
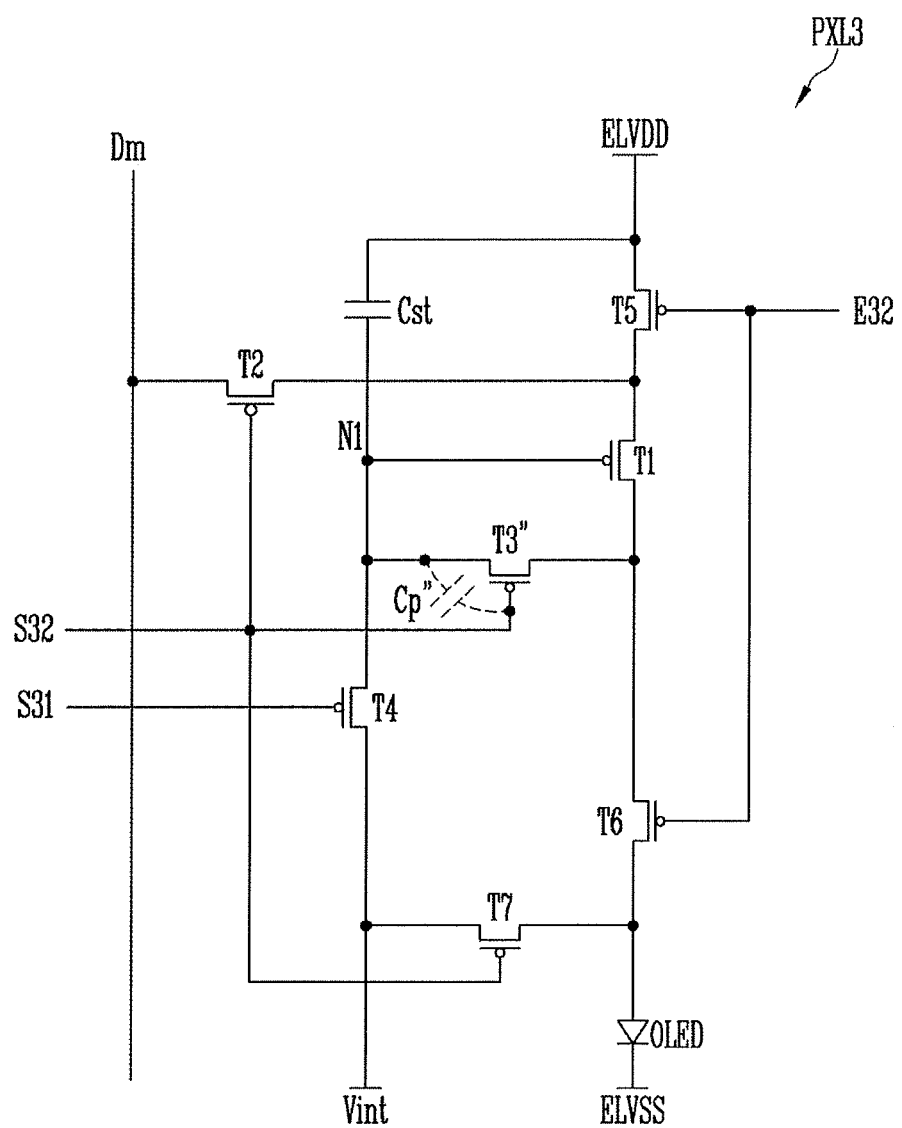
FIG. 14C illustrates another embodiment of the third pixel of FIG. 7.

FIG. 14A illustrates another embodiment of the first pixel of FIGS. 5, 7, 8, and 9. FIG. 14B illustrates another embodiment of the second pixel of FIGS. 5 and 7. FIG. 14C illustrates another embodiment of the third pixel of FIG. 7. Here, the first pixel PXL1, the second pixel PXL2, and the third pixel PXL3 have the same circuit configuration other than mounting areas of the third transistors T3, T3', and T3".

The second pixel PXL2' and the third pixel PXL3' illustrated in FIG. 8 and the second pixel PXL2" illustrated in FIG. 9 are set to have the same circuit configuration as described in FIGS. 14A through 14C other than mounting areas of the third transistors.

Here, the mounting areas of the third transistors T3, T3', and T3" may change by controlling channel widths W and/or channel lengths L. When the mounting areas of the third transistors T3, T3', and T3" change, capacities of parasitic capacitors Cp, Cp', and Cp" respectively formed in the third transistors T3, T3', and T3" change. The parasitic capacitors Cp, Cp', and Cp" perform the same functions as the above-described boosting capacitors Cb, Cb', and Cb".

The mounting areas of the third transistors T3, T3', and T3" described hereinafter (i.e., the capacities of the parasitic capacitors Cp, Cp', and Cp") are relatively determined to correspond to the widths of the respective pixel regions and are not limited to specific numbers. In describing FIGS. 14A through 14C, the same elements as those of FIGS. 11A through 11C are denoted by the same reference numerals and detailed description thereof will not be given. In addition, numerous parasitic capacitors are formed between electrodes of each of the transistors. However, in FIGS. 14A through 14C, only the parasitic capacitors Cp, Cp', and Cp" required for describing the present embodiment are illustrated.

Referring to FIG. 14A, the first pixel PXL1 according to the embodiment includes an OLED OLED, first through seventh transistors T1 through T7, and a storage capacitor Cst.

The third transistor T3 is connected between a second electrode of the first transistor T1 and a first node N1. A gate electrode of the third transistor T3 is connected to the ith first scan line S1i. The third transistor T3 is turned on when the scan signal is supplied to the ith first scan line S1i and electrically connects the second electrode of the first transistor T1 and the first node N1. Therefore, when the third transistor T3 is turned on, the first transistor T1 is diode-connected.

On the other hand, the parasitic capacitor Cp is formed between a second electrode of the third transistor T3 and a gate electrode of the third transistor T3. The parasitic capacitor Cp functions as a boosting capacitor that increases a voltage of the first node N1 in response to the scan signal supplied to the ith first scan line S1i. The parasitic capacitor Cp may have a lower capacity than the above-described boosting capacitor Cb and boosts a lower voltage than the boosting capacitor Cb. In addition, the second pixel PXL2 and the third pixel PXL3 have the same configuration as the first pixel PXL1 other than the third transistors T3, T3', and T3".

According to another embodiment, the third transistor T3 in the first pixel PXL1, the third transistor T3' in the second pixel PXL2, and the third transistor T3" in the third pixel PXL3 have different mounting areas so that the brightness difference between the first pixel region PA1 and the second pixel region PA2 and the brightness difference between the second pixel region PA2 and the third pixel region PA3 may be compensated. When the mounting areas of the third transistors T3, T3', and T3" change, the capacities of the parasitic capacitors Cp, Cp', and Cp" are differ.

For example, the mounting area of the third transistor T3 in the first pixel PXL1 is larger than the mounting area of the third transistor T3' included in the second pixel PXL2 so that the brightness difference between the first pixel region PA1 and the second pixel region PA2 may be compensated. Then, the parasitic capacitor Cp included in the first pixel PXL1 is set to have higher capacity than the parasitic capacitor Cp' included in the second pixel PXL2.

The mounting area of the third transistor T3' included in the second pixel PXL2 is set to be larger than the mounting area of the third transistor T3" included in the third pixel PXL3 so that the brightness difference between the second pixel region PA2 and the third pixel region PA3 may be compensated. Then, the parasitic capacitor Cp' included in the second pixel PXL2 has a higher capacity than the parasitic capacitor Cp" included in the third pixel PXL3.

On the other hand, since the boosted voltages increase in proportion to the capacities of the parasitic capacitors Cp, Cp', and Cp", the parasitic capacitor Cp included in the first pixel PXL1 transits a voltage of the first node N1 to a higher voltage than the parasitic capacitor Cp' included in the second pixel PXL2.

The parasitic capacitor Cp' included in the second pixel PXL2 transits a voltage of the first node N1 to a higher voltage than the boosting capacitor Cb" included in the third pixel PXL3.

Specifically, in the organic light emitting display device of FIG. 5, when the capacities of the parasitic capacitors Cp and Cp' in the first pixel PXL1 and the second pixel PXL2 are the same, when the data signals having the same voltage are supplied to correspond to the RC loads of the scan lines S1 and S2, the first voltage is stored in the first pixels PXL1 and the second voltage, higher than the first voltage, is stored in the second pixels PXL2.

According to the embodiment, when the parasitic capacitor Cp in the first pixel PXL1 has a higher capacity than the parasitic capacitor Cp' in the second pixel PXL2, the voltage boosted in the first pixel PXL1 is higher than the voltage boosted in the second pixel PXL2. Then, the voltage difference corresponding to the RC loads of the scan lines S1 and S2 may be compensated so that the brightness difference between the first pixel region PA1 and the second pixel region PA2 may be minimized.

In addition, in the organic light emitting display device of FIG. 7, when the capacities of the parasitic capacitors Cp, Cp', and Cp" included in the first pixel PXL1, the second pixel PXL2, and the third pixel PXL3 are the same, in the case in which the data signals having the same voltage are supplied to correspond to the RC loads of the scan lines S1, S2, and S3, the first voltage is stored in the first pixels PXL1, the second voltage higher than the first voltage is stored in the second pixels PXL2, and the third voltage higher than the second voltage is stored in the third pixels PXL3.

In order to compensate for voltage differences, according to the embodiment, the parasitic capacitor Cp in the first pixel PXL1 has a higher capacity than the parasitic capacitor Cp' in the second pixel PXL2 and the parasitic capacitor Cp' in the second pixel PXL2 has a higher capacity than the parasitic capacitor Cp" in the third pixel PXL3. Then, since the voltage boosted in the first pixel PXL1 is higher than the voltage boosted in the second pixel PXL2 and the voltage boosted in the second pixel PXL2 is higher than the voltage boosted in the third pixel PXL3, the first pixel PXL1, differences in voltages stored in the first pixel PXL1, the second pixel PXL2, and the third pixel PXL3 in response to the data signals having the same voltage may be minimized.

As described above, according to another embodiment, the mounting areas of the third transistors respectively in the pixels are controlled so that parasitic capacitors of pixels positioned in regions with large widths have higher capacities than parasitic capacitors of pixels positioned in regions with small widths. Then, brightness differences corresponding to widths of pixel regions may be compensated.

The parasitic capacitors respectively included in the second pixels PXL2' and the third pixels PXL3' of the organic light emitting display device of FIG. 8 have lower capacities than the parasitic capacitors respectively included in the first pixels PXL1. For this purpose, the mounting areas of the third transistors respectively in the second pixels PXL2' and the third pixels PXL3' are smaller than the mounting areas of the third transistors respectively included in the first pixels PXL1. Then, the brightness difference between the first pixel region PA1 and the second pixel region PA2' and the brightness difference between the second pixel region PA2' and the third pixel region PA3' may be compensated.

In addition, the parasitic capacitors respectively included in the second pixels PXL2" of the organic light emitting display device illustrated in FIG. 9 have lower capacities than the parasitic capacitors respectively included in the first pixels PXL1. For this purpose, the mounting areas of the third transistors respectively in the second pixels PXL2" are smaller than the mounting areas of the third transistors respectively in the first pixels PXL1. Then, the brightness difference between the first pixel region PA1 and the second pixel region PA2" may be compensated.

In addition, the capacities of the parasitic capacitors respectively included in the second pixels PXL2" may vary by region of FIG. 10. For example, the parasitic capacitors respectively included in the second pixels PXL2" in the first region Re1 with a large width may have higher capacities than the parasitic capacitors respectively included in the second pixels PXL2" in the jth region Rej with a small width. For this purpose, the mounting areas of the third transistors respectively included in the second pixels PXL2" in the first region Re1 with the large width may be larger than the mounting areas of the third transistors respectively included in the second pixels PXL2" in the jth region Rej with the small width.

Figure 15A:
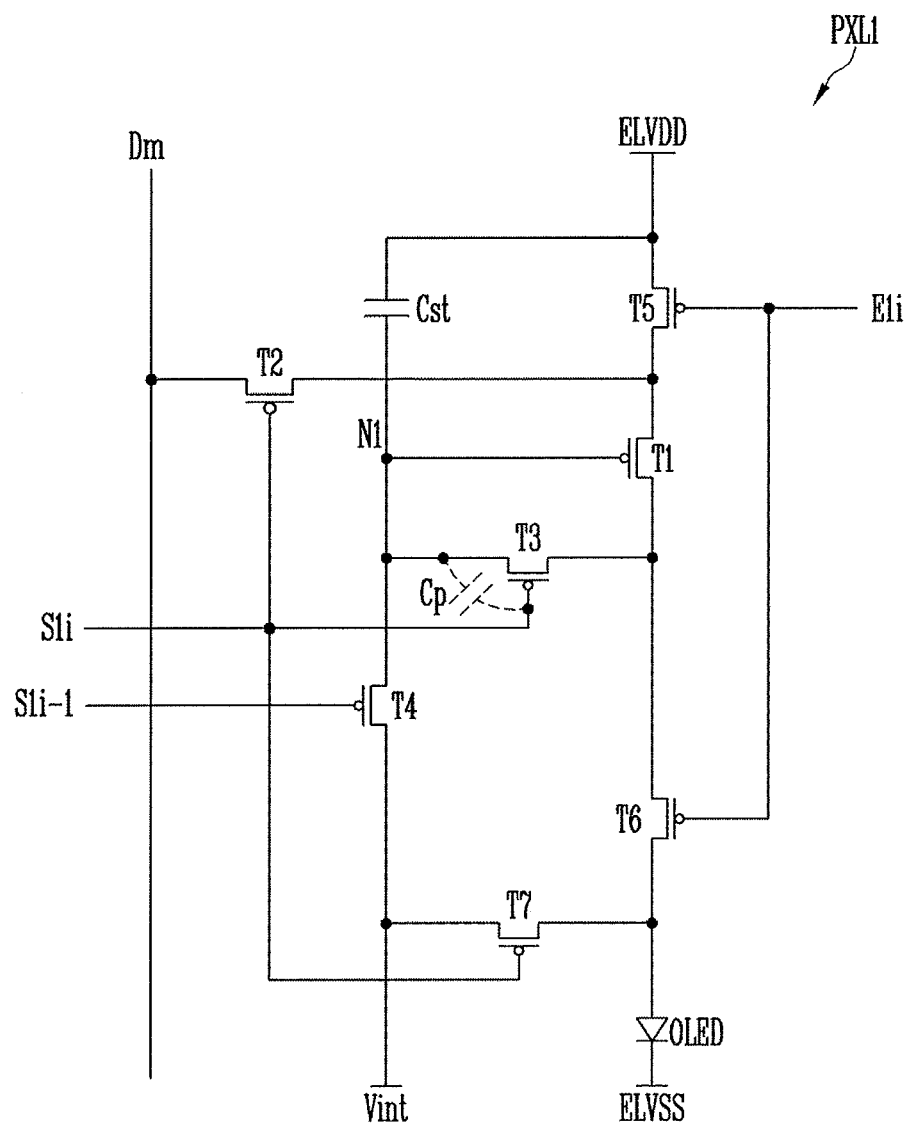
FIG. 15A illustrates another embodiment of the first pixel of FIGS. 5, 7, 8, and 9.
Figure 15B:
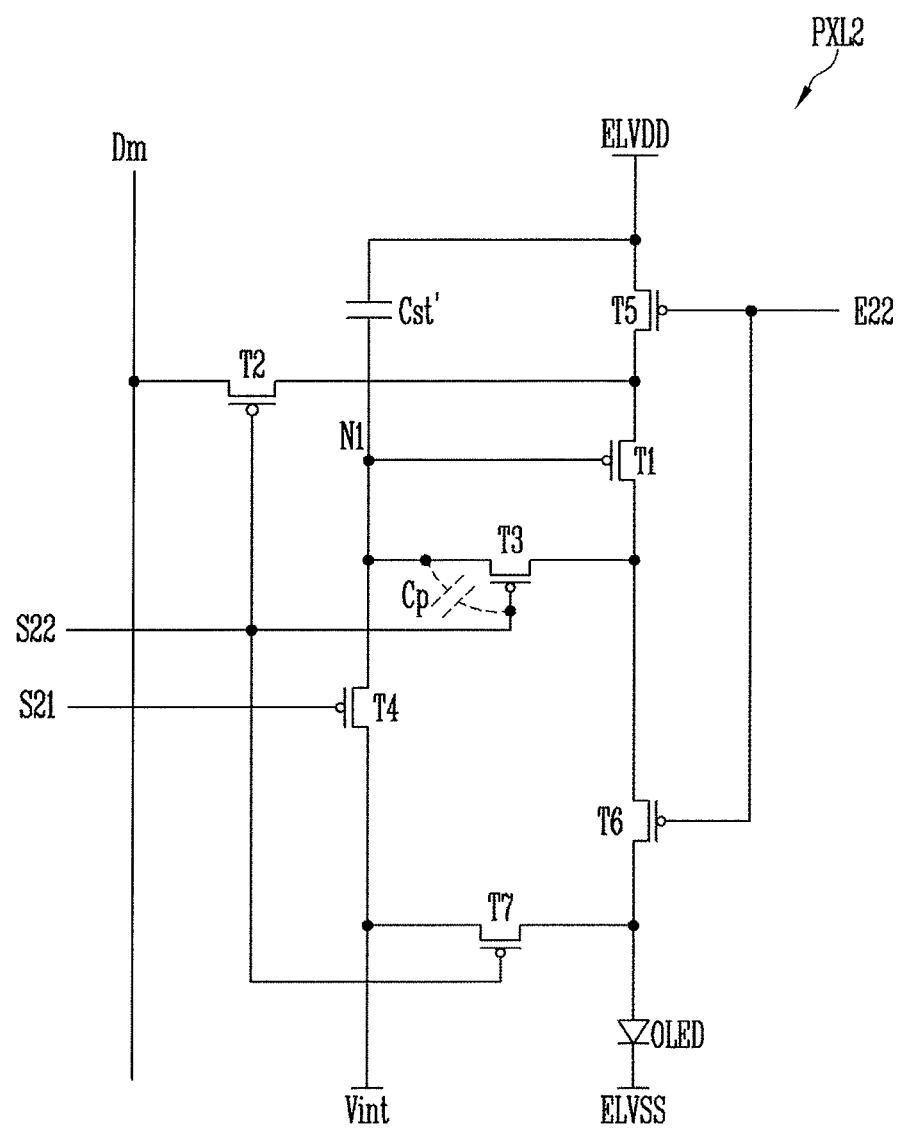
FIG. 15B illustrates another embodiment of the second pixel of FIGS. 5 and 7.
Figure 15C:
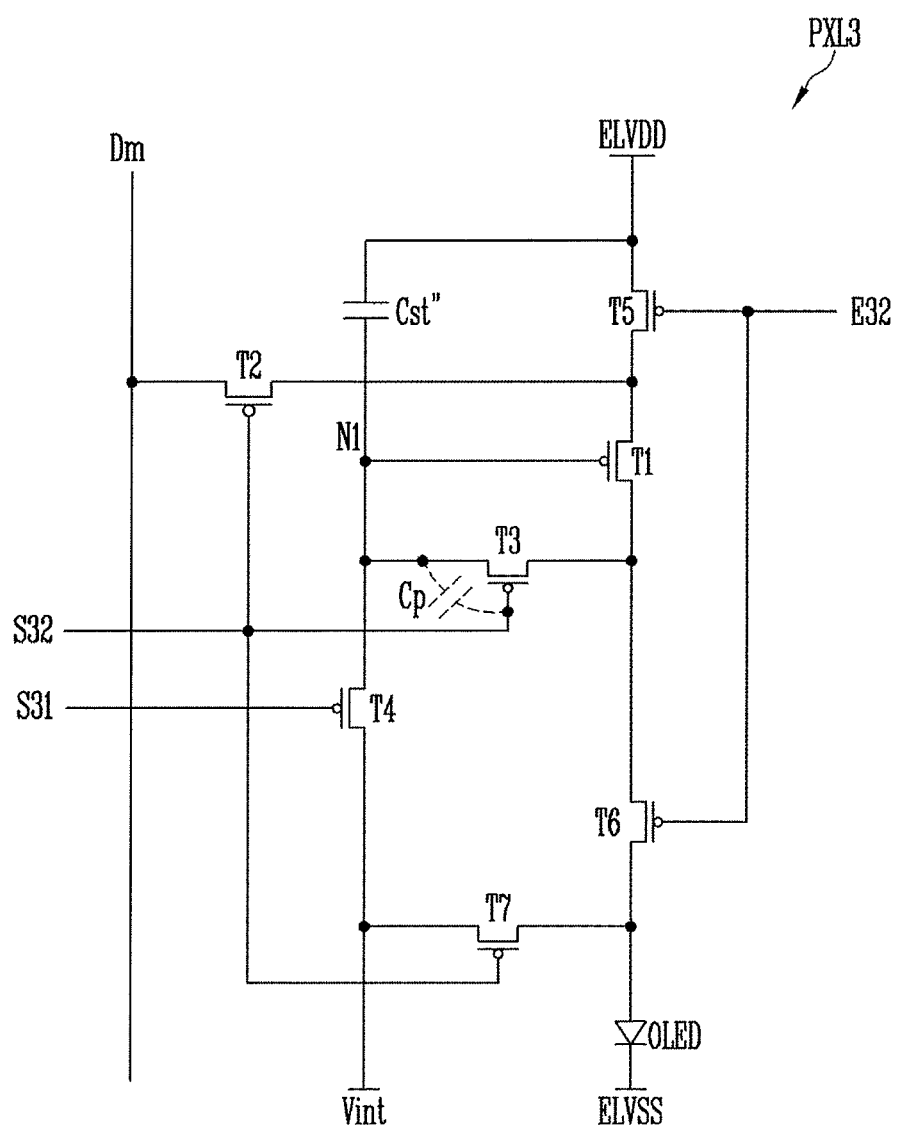
FIG. 15C illustrates another embodiment of the third pixel of FIG. 7.

FIG. 15A illustrates another embodiment of the first pixel of FIGS. 5, 7, 8, and 9. FIG. 15B illustrates another embodiment of the second pixel of FIGS. 5 and 7. FIG. 15C illustrates another embodiment of the third pixel of FIG. 7. Here, the first pixel PXL1, the second pixel PXL2, and the third pixel PXL3 are set to have the same circuit configuration other than capacities of storage capacitors Cst, Cst', and Cst".

The second pixel PXL2' and the third pixel PXL3' illustrated in FIG. 8 and the second pixel PXL2" illustrated in FIG. 9 have the same circuit configuration as illustrated in FIGS. 15A through 15C other than capacities of storage capacitors.

The capacities of the storage capacitors Cst, cst', and Cst" described hereinafter are relatively determined to correspond to the widths of the respective pixel regions and are not limited to specific numbers. In describing FIGS. 15A through 15C, the same elements as those of FIGS. 11A through 11C are denoted by the same reference numerals and detailed description thereof will not be given.

Referring to FIG. 15A, the first pixel PXL1 according to the embodiment includes an OLED OLED, first through seventh transistors T1 through T7, and a storage capacitor Cst. The storage capacitor Cst is connected between the first power source ELVDD and a first node N1. The storage capacitor Cst stores a voltage corresponding to a voltage of the first node N1.

In addition, a parasitic capacitor Cp is formed between a second electrode of the third transistor T3 and a gate electrode of the third transistor T3. Actually, parasitic capacitors are formed between electrodes of each of the transistors. However, in FIGS. 15A through 15C, only the parasitic capacitor Cp required for describing the present embodiment is illustrated.

The parasitic capacitor Cp connected between the second electrode of the third transistor T3 and the gate electrode of the third transistor T3 functions as a boosting capacitor that increases a voltage of the first node N1 in response to the scan signal supplied to the ith first scan line S1$i$.

The second pixel PXL2 and the third pixel PXL3 have the same configuration as the first pixel PXL1 other than the capacity of the storage capacitor Cst.

According to another embodiment, the storage capacitor Cst in the first pixel PXL1, the storage capacitor Cst' in the second pixel PXL2, and the storage capacitor Cst" in the third pixel PXL3 have different capacities so that the brightness difference between the first pixel region PA1 and the second pixel region PA2 and the brightness difference between the second pixel region PA2 and the third pixel region PA3 may be compensated.

For example, the storage capacitor Cst in the first pixel PXL1 may have a lower capacity than the storage capacitor Cst' in the second pixel PXL2 so that the brightness difference between the first pixel region PA1 and the second pixel region PA2 may be compensated. The storage capacitor Cst' in the second pixel PXL2 may have a lower capacity than the storage capacitor Cst" in the third pixel PXL3 so that the brightness difference between the second pixel region PA2 and the third pixel region PA3 may be compensated.

Specifically, the voltage of the first node N1 boosted by the parasitic capacitor Cp is determined by ratios of the parasitic capacitor Cp to the storage capacitors Cst, Cst', and Cst". That is, as the capacities of the storage capacitors Cst, Cst', and Cst" decrease, the voltage of the first node N1 increased by the parasitic capacitor Cp increases.

Therefore, when the data signals having the same voltage are supplied, a voltage increase rate of the first node N1 of the first pixel PXL1 including the storage capacitor Cst having the lowest capacity is set to be highest and a voltage increase rate of the first node N1 of the third pixel PXL3 including the storage capacitor Cst" having the highest capacity is set to be lowest. In addition, as the capacities of the storage capacitors Cst, Cst', and Cst" increase, increase speeds of voltages charged in the storage capacitors Cst, Cst', and Cst" are reduced, so that the voltage finally applied to the first node N1 decreases.

Specifically, in the organic light emitting display device of FIG. 5, in the case in which the capacities of the storage capacitors Cst and Cst' in the first pixel PXL1 and the second pixel PXL2 are the same, when the data signals having the same voltage are supplied to correspond to the RC loads of the scan lines S1 and S2, the first voltage is stored in the first pixels PXL1 and the second voltage higher than the first voltage is stored in the second pixels PXL2.

According to the embodiment, when the storage capacitor Cst in the first pixel PXL1 has a lower capacity than the storage capacitor Cst' in the second pixel PXL2, the voltage of the first node N1 of the first pixel PXL1 may additionally increase in response to the data signals having the same voltage. Then, the voltage difference corresponding to the RC loads of the scan lines S1 and S2 may be compensated for so that the brightness difference between the first pixel region PA1 and the second pixel region PA2 may be minimized.

In addition, in the organic light emitting display device of FIG. 7, when the capacities of the storage capacitors Cst, Cst', and Cst" in the first pixel PXL1, the second pixel PXL2, and the third pixel PXL3 are the same, in the case in which the data signals having the same voltage are supplied to correspond to the RC loads of the scan lines S1, S2, and S3, the first voltage is stored in the first pixels PXL1, the second voltage higher than the first voltage is stored in the second pixels PXL2, and the third voltage higher than the second voltage is stored in the third pixels PXL3.

In order to compensate for voltage differences, according to the embodiment, the storage capacitor Cst in the first pixel PXL1 has a lower capacity than the storage capacitor Cst' in the second pixel PXL2 and the storage capacitor Cst' in the second pixel PXL2 is set to have lower capacity than the storage capacitor Cst" in the third pixel PXL3. Then, the voltage of the first node N1 of the first pixel PXL1 may additionally increase in comparison with the second pixel PXL2 and the voltage of the first node N1 of the second pixel PXL2 may additionally increase in comparison with the third pixel PXL3. In this case, differences in voltages stored in the first pixel PXL1, the second pixel PXL2, and the third pixel PXL3 may be minimized so that the brightness difference between the first pixel region PA1 and the second pixel region PA2 and the brightness difference between the second pixel region PA2 and the third pixel region PA3 may be minimized.

As described above, according to another embodiment, the storage capacities of pixels positioned in regions with large widths are set to have lower capacities than storage capacitors of pixels positioned in regions with small widths. Then, brightness differences corresponding to widths of pixel regions may be compensated for.

The storage capacitors respectively included in the second pixels PXL2' and the third pixels PXL3' of the organic light emitting display device of FIG. 8 have higher capacities than the storage capacitors respectively included in the first pixels PXL1. Then, the brightness difference between the first pixel region PA1 and the second pixel region PA2' and the brightness difference between the second pixel region PA2' and the third pixel region PA3' may be compensated.

In addition, the storage capacitors respectively included in the second pixels PXL2" of the organic light emitting display device illustrated in FIG. 9 have higher capacities than the storage capacitors respectively included in the first pixels PXL1. Then, the brightness difference between the first pixel region PA1 and the second pixel region PA2" may be compensated.

In addition, the capacities of the parasitic capacitors respectively included in the second pixels PXL2" may vary by region of FIG. 10. For example, the storage capacitors respectively included in the second pixels PXL2" in the first region Re1 with a large width may have lower capacities than the storage capacitors respectively included in the second pixels PXL2" in the jth region Rej with a small width.

In addition, according to the present embodiment, for convenience sake, the transistors are illustrated as PMOSs. However, embodiments are not limited thereto not limited thereto. That is, the transistors may be formed of n-channel metal-oxide-semiconductor field effect transistor (MOS-FETs) (NMOSs).

According to the present embodiment, the OLED OLED may generate various light components including red light, green light, and blue light in response to an amount of current supplied from the driving transistor. However, embodiments are not limited thereto. For example, the OLED OLED may generate white light in response to the amount of current supplied from the driving transistor. In this case, a color image may be implemented by using an additional color filter.

In the display device according to the embodiment, pixels are formed in a plurality of pixel regions with different widths. Each of the pixels in different pixel regions includes specific transistors with different W/Ls and/or specific capacitors with different capacities. That is, a brightness difference between pixel regions with different widths may be minimized by using the W/Ls of the specific transistors respectively included the pixels and/or the capacities of the specific capacitors respectively included the pixels.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
    a first pixel region having a first scan line and a second pixel region having a second scan line;
    first pixels connected to the first scan line in the first pixel region, each first pixel including a first transistor; and
    second pixels connected to the second scan line in the second pixel region, each second pixel including a second transistor performing a same function as the first transistor,
    wherein a number of first pixels is greater than a number of second pixels, and
    wherein at least one of a channel width (W) and a channel length (L) of the first and second transistors is different from one another.

2. The display device as claimed in claim 1, wherein the first pixel region has a larger width than the second pixel region.

3. The display device as claimed in claim 2, wherein
the first transistor and the second transistor are driving transistors, and
a W/L of the first transistor is smaller than a W/L of the second transistor.

4. The display device as claimed in claim 2, wherein
the first transistor and the second transistor are control transistors for diode-connecting driving transistors, and
a mounting area of the first transistor larger than a mounting area of the second transistor.

5. The display device as claimed in claim 2, further comprising:
a third pixel region having a third scan line; and
third pixels connected to the third scan line in the third pixel region, each third pixel including a third transistor performing the same function as the first transistor,
wherein a number of third pixels is less than the number of second pixels.

6. The display device as claimed in claim 5, wherein the third pixel region has a smaller width than the second pixel region.

7. The display device as claimed in claim 6, wherein
the first transistor, the second transistor, and the third transistor are driving transistors,
a W/L of the first transistor is smaller than a W/L of the second transistor, and
a W/L of the third transistor is larger than the W/L of the second transistor.

8. The display device as claimed in claim 6, wherein
the first transistor, the second transistor, and the third transistor are control transistors for diode-connecting driving transistors,
a mounting area of the first transistor is larger than a mounting area of the second transistor, and
a mounting area of the third transistor is smaller than the mounting area of the second transistor.

9. The display device as claimed in claim 2, further comprising:
a third pixel region having the same width as the second pixel region; and
third pixels in the third pixel region, each including a third transistor performing the same function as the first transistor.

10. The display device as claimed in claim 9, wherein a W/L of the third transistor is equal to be a W/L of the second transistor.

11. The display device as claimed in claim 10, wherein the second transistor and the third transistor are driving transistors.

12. The display device as claimed in claim 10, wherein the second transistor and the third transistor are control transistors for diode-connecting driving transistors.

13. The display device as claimed in claim 2, wherein a width of the second pixel region gradually decreases from a first width to a second width, smaller than the first width.

14. The display device as claimed in claim 13, wherein the second pixel region is divided into j, where j is a natural number of no less than 2, regions including at least one horizontal line.

15. The display device as claimed in claim 14, wherein each of the j regions includes no less than two horizontal lines, and
W/Ls of the second transistors in a same region of the j regions are the same.

16. The display device as claimed in claim 14, wherein the second transistor is a driving transistor, and
W/Ls of the second transistors differ between the j regions.

17. The display device as claimed in claim 16, wherein a W/L of the second transistor larger in a region having a smaller width.

18. The display device as claimed in claim 14, wherein
the second transistor is a control transistor for diode-connecting driving transistors, and
mounting areas of the second transistors differ between the j regions.

19. The display device as claimed in claim 18, wherein a mounting area of the second transistor is smaller in a region having a smaller width.

20. A display device, comprising:
a first pixel region having a first scan line and a second pixel region having a second scan line;
first pixels connected to the first scan line in the first pixel region, each first pixel including a first capacitor; and
second pixels connected to the second scan line in the second pixel region, each second pixel including a second capacitor performing a same function as the first capacitor,
wherein a number of first pixels is greater than a number of second pixels, and
wherein capacitances of the first capacitor and the second capacitor differ.

21. The display device as claimed in claim 20, wherein the first pixel region has a larger width than the second pixel region.

22. The display device as claimed in claim 20, wherein
the first capacitor and the second capacitor are storage capacitors to store voltages of data signals, and
the first capacitor has a lower capacity than the second capacitor.

23. The display device as claimed in claim 20, wherein
the first capacitor and the second capacitor are boosting capacitors between a scan line and a driving transistor, and
the first capacitor has a higher capacity than the second capacitor.

24. A display device, comprising:
first pixels connected to a first scan line in a first pixel region having a first width; and
second pixels connected to a second scan line in a second pixel region having a second width different from the first width,
wherein a number of first pixels is greater than a number of second pixels, and
wherein each of the first pixels and the second pixels includes:
an organic light emitting diode (OLED);
a first transistor to control an amount of current that flows from a first power source connected to a first electrode to a second power source via the OLED; and
a second transistor connected between a data line and the first electrode of the first transistor,
wherein at least one of a channel width (W) and a channel length (L) of at least one of the first transistor and the second transistor in the first and second pixels is different from one another.

25. The display device as claimed in claim 24, wherein the first width has a larger width than the second width.

26. The display device as claimed in claim 25, wherein a W/L of the first or second transistor in the first pixel is set to be smaller than a W/L of the first or second transistor in the second pixel.

27. The display device as claimed in claim 25, wherein each of the first pixels and the second pixels further includes a third transistor connected between a gate electrode of the first transistor and a second electrode of the first transistor.

28. The display device as claimed in claim 27, wherein a mounting area of the third transistor in the first pixel is larger than a mounting area of the third transistor included in the second pixel.

29. The display device as claimed in claim 27, wherein each of the first pixels and the second pixels further includes a boosting capacitor connected between a scan line and the gate electrode of the first transistor.

30. The display device as claimed in claim 29, wherein the boosting capacitor in the first pixel has a higher capacity than the boosting capacitor in the second pixel.

31. The display device as claimed in claim 27, wherein each of the first pixels and the second pixels further include a storage capacitor connected between the gate electrode of the first transistor and the first power source.

32. The display device as claimed in claim 31, wherein the storage capacitor in the first pixel has lower capacity than the storage capacitor in the second pixel.

\* \* \* \* \*